(12) United States Patent
Chang et al.

(10) Patent No.: US 10,861,840 B2
(45) Date of Patent: Dec. 8, 2020

(54) INTEGRATED PASSIVE COMPONENT AND METHOD FOR MANUFACTURING THE SAME

(71) Applicant: Advanced Semiconductor Engineering, Inc., Kaohsiung (TW)

(72) Inventors: Yung-Shun Chang, Kaohsiung (TW); Teck-Chong Lee, Kaohsiung (TW); Chien-Hua Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 576 days.

(21) Appl. No.: 15/691,014

(22) Filed: Aug. 30, 2017

(65) Prior Publication Data

US 2019/0067261 A1 Feb. 28, 2019

(51) Int. Cl.
*H01L 27/01* (2006.01)
*H01L 49/02* (2006.01)
*H01L 21/683* (2006.01)

(52) U.S. Cl.
CPC .......... *H01L 27/01* (2013.01); *H01L 21/6835* (2013.01); *H01L 28/10* (2013.01); *H01L 28/60* (2013.01); *H01L 2221/68345* (2013.01)

(58) Field of Classification Search
CPC ......... H01L 27/01; H01L 28/60; H01L 28/10; H01L 21/6835; H01L 2221/68345; H01L 21/4853; H01L 23/49816; H01L 23/49838; H01L 25/18
USPC .......................................................... 361/270
See application file for complete search history.

(56) References Cited

U.S. PATENT DOCUMENTS 10,490,341 B2 * 11/2019 Kung .................. H01F 27/2847

* cited by examiner

*Primary Examiner* — Dharti H Patel
(74) *Attorney, Agent, or Firm* — Foley & Lardner LLP

(57) ABSTRACT

An integrated passive component comprises a capacitor, a first passivation layer, an inductor, an insulation layer and an external contact. The first passivation layer surrounds the capacitor. The inductor is on the first passivation layer and electrically connected to the capacitor. The inductor comprises a plurality of conductive pillars. The insulation layer is on the first passivation layer and surrounds each of the conductive pillars. The insulation layer comprises a first surface adjacent to the first passivation layer, a second surface opposite to the first surface, and a side surface extending between the first surface and the second surface. A ratio of a width of each of the conductive pillars to a height of each of the conductive pillars is about 1:7. The external contact is electrically connected to the inductor and contacts the second surface of the insulation layer and the side surface of the insulation layer.

29 Claims, 28 Drawing Sheets

INTEGRATED PASSIVE COMPONENT AND METHOD FOR MANUFACTURING THE SAME

BACKGROUND

1. Technical Field

The present disclosure relates to an integrated passive component and a method for manufacturing the same. In particular, the present disclosure relates to a surface-mount technology (SMT) type integrated passive device (IPD) formed by a wafer/panel level packaging process.

2. Description of the Related Art

A dimension of passive components (e.g., capacitors or inductors) plays a pivotal role in miniaturization of an electronic product. As technologies progress, a thickness of a passive component may be greater than a thickness of an active component (e.g., a semiconductor device or die), which adversely affects shrinkage of a semiconductor device package. Integrated passive device (IPD) technique is developed to embed passive components in a package substrate to reduce a thickness of a semiconductor device package. However, electrical connections between IPDs and a semiconductor device may rely on wire-bond or flip-chip technique, and such electrical connections are relatively vulnerable. Moreover, it would be difficult to replace/change the embedded IPDs by other components (e.g., for impedance matching).

SUMMARY

In one or more embodiments, an integrated passive component comprises a capacitor, a first passivation layer, an inductor, an insulation layer and an external contact. The first passivation layer surrounds the capacitor. The inductor is disposed on the first passivation layer and electrically connected to the capacitor. The inductor comprises a plurality of conductive pillars. The insulation layer is disposed on the first passivation layer and surrounds each of the conductive pillars. The insulation layer comprises a first surface adjacent to the first passivation layer, a second surface opposite to the first surface and a side surface extending between the first surface and the second surface. A ratio of a width of each of the conductive pillars to a height of each of the conductive pillars is about 1:7. The external contact is electrically connected to the inductor and contacts the second surface of the insulation layer and the side surface of the insulation layer.

In one or more embodiments, an integrated passive component comprises a first passivation layer, an insulation layer, a plurality of first metal strips, a plurality of second metal strips, a plurality of conductive pillars, and an external contact comprising a pre-solder layer. The insulation layer is adjacent to the first passivation layer. The insulation layer comprises a first surface adjacent to the first passivation layer, a second surface opposite to the first surface and a side surface extending between the first surface and the second surface. The plurality of first metal strips are disposed on the first passivation layer. The plurality of second metal strips are disposed on the second surface. The plurality of conductive pillars are disposed within the insulation layer. Each of the conductive pillars penetrates the insulation layer and connects a corresponding first metal strip and a corresponding second metal strip. The external contact is electrically connected to at least one of the plurality of second metal strips and contacts the second surface of the insulation layer and the side surface of the insulation layer.

In one or more embodiments, a method for manufacturing an integrated passive component comprises forming a plurality of first conductive pillars and a second conductive pillar on a substrate, forming an insulation layer surrounding the first conductive pillars and the second conductive pillar, forming an upper passivation layer on the insulation layer and exposing the second conductive pillar, and sawing the second conductive pillar to form an external contact.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are techniques for providing an integrated passive component. In particular, some embodiments of the present disclosure relate to a SMT type IPD formed by a wafer/panel level packaging process.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Figure 1:
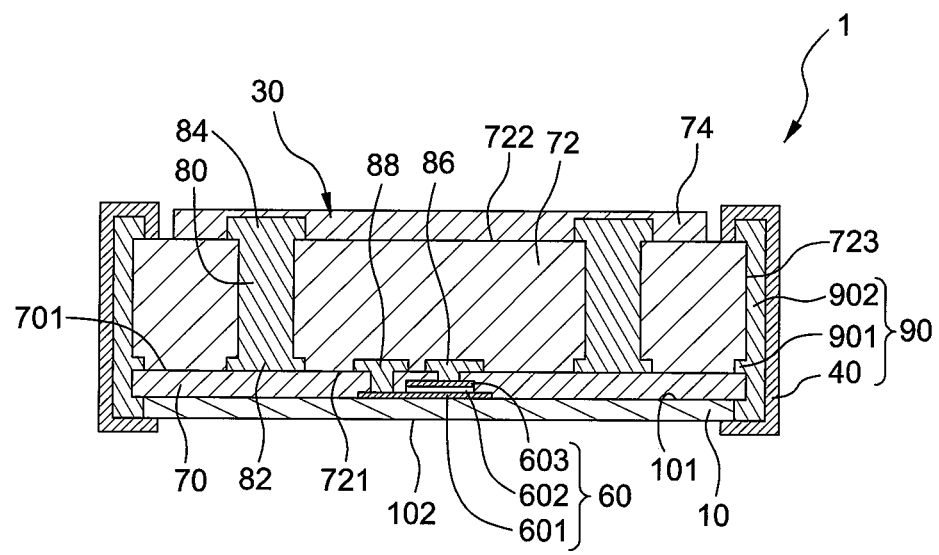
FIG. 1 is a cross-sectional view of an integrated passive component in accordance with some embodiments of the present disclosure.

FIG. 1 is a cross-sectional view of an integrated passive component 1 in accordance with some embodiments of the present disclosure. The integrated passive component 1 includes a substrate 10, a capacitor 60, passivation layers 70 and 74, an inductor 30, an insulation layer 72, metal strips 82, 84, 86 and 88, conductive pillars 80 and an external contact 90. The insulation layer 72 may be also a support layer.

In one or more embodiments, the substrate 10 includes glass, silicon, silicon dioxide ($SiO_2$), or other suitable materials. In one or more embodiments, a thickness of the substrate 10 is in a range of about 10 micrometers (μm) to about 50 μm. In one or more embodiments, the thickness of the substrate 10 is in a range of about 50 μm to about 150 μm. The substrate 10 has a top surface 101 and a bottom surface 102 opposite to the top surface 101.

The capacitor 60 is disposed on the surface 101 of the substrate 10. The passivation layer 70 is disposed on the surface 101 of the substrate 10 and surrounds the capacitor 60. The passivation layer 70 has a top surface 701. The capacitor 60 includes a top electrode 603, a bottom electrode 601 and a dielectric layer 602 between the top electrode 603 and the bottom electrode 601. In one or more embodiments, the electrodes 601 and 603 include, for example, copper (Cu), or other metal, or a metal alloy, or other conductive material. The dielectric layer 602 includes silicon nitride ($SiN_x$), tantalum pentoxide ($Ta_2O_5$), titanium monoxide (TiO), another metal or non-metal oxide or nitride, or other suitable materials. In one or more embodiments, the bottom electrode 601 contacts the substrate 10.

The insulation layer 72 is disposed on the surface 701 of the passivation layer 70 and surrounds each of the conductive pillars 80. The insulation layer 72 includes a bottom surface 721 adjacent to the passivation layer 70, a top surface 722 opposite to the surface 721 and a side surface 723 extending between the surface 721 and the surface 722. Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 82 are disposed on the surface 701 and multiple metal strips 84 are disposed on the surface 722. In one or more embodiments, the insulation layer 72 is a wafer-level packaging polyimide (PI) film or an organic polymer film.

The metal strip 86 is disposed on the surface 701 and connected with the top electrode 603 through an extension portion penetrating the passivation layer 70. The metal strip 88 is disposed on the surface 701 and connected with the bottom electrode 601 through an extension portion penetrating the passivation layer 70. The metal strip 86 and the metal strip 88 are respectively connected with the corresponding metal strip 84 through the corresponding conductive pillar 80. The metal strip 86 is electrically connected with the top electrode 603 and the metal strip 88 is electrically connected with the bottom electrode 601. A ratio of a width of each of the conductive pillars 80 to a height of each of the conductive pillars 80 is in a range of about 1:10 to about 1:5, or about 1:7. In one or more embodiments, the width of each of the conductive pillars 80 may be about 18 μm to about 22 μm and the height of each of the conductive pillars 80 may be about 126 μm to about 154 μm. In one or more embodiments, the conductive pillars 80 and the metal strips 82, 84, 86 and 88 include, for example, Cu, or other metal, or a metal alloy, or other conductive material.

The inductor 30 is disposed on the passivation layer 70 and electrically connected to the capacitor 60. In one or more embodiments, the inductor 30 includes multiple conductive pillars 80, multiple metal strips 82 disposed on the surface 701 and multiple metal strips 84 disposed on the surface 722. Each conductive pillar 80 penetrates through the insulation layer 72 and connects the corresponding metal strip 82 and the corresponding metal strip 84. The passivation layer 74 covers the metal strips 84. The passivation layer 70 covers the metal strips 82.

The external contact 90 is electrically connected to the inductor 30. The external contact 90 contacts the surface 721 of the insulation layer 72, the surface 722 of the insulation layer 72 and the side surface 723 of the insulation layer 72. The external contact 90 contacts the surface 722 and a portion of the side surface 723. In one or more embodiments, the external contact 90 is electrically connected to at least one of the metal strips 84 and contacts the surface 722 of the insulation layer 72 and the side surface 723 of the insulation layer 72.

The external contact 90 includes a first portion 901 and a second portion 902. In one or more embodiments, the first portion 901 and the second portion 902 include, for example, Cu, or other metal, or a metal alloy, or other conductive material. The first portion 901 contacts the surface 721 of the insulation layer 72. The second portion 902 contacts the surface 722 of the insulation layer 72 and a portion of the side surface 723 of the insulation layer 72. The external contact 90 includes a pre-solder layer 40 on the first portion 901 and the second portion 902. The pre-solder layer 40 contacts the surface 102 of the substrate 10. An increased electrical contact area (such as the external contact 90) reinforces a bonding force. In one or more embodiments, the pre-solder layer 40 includes, for example, tin (Sn), silver (Ag), SnAg, or other metal or alloy, or other conductive material. A dimension of a semiconductor device package can be reduced due to the increased electrical contact area. In one or more embodiments, the pre-solder layer 40 on the external contact 90 of the integrated passive component 1 can facilitate replacement/change of the component 1.

Figure 2A:
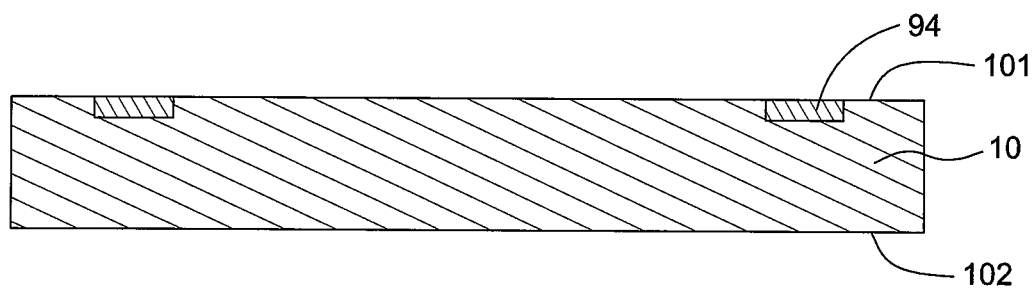
FIG. 2A, FIG. 2B, FIG. 2C, FIG. 2D, and FIG. 2E illustrate a method for manufacturing the integrated passive component of FIG. 1 in accordance with some embodiments.

FIG. 2A, FIG. 2B, FIG. 2C, FIG. 2D, and FIG. 2E illustrate a method for manufacturing an integrated passive component 1 of FIG. 1 in accordance with some embodiments. Referring to FIG. 2A, a substrate 10 is provided. The substrate 10 has a top surface 101 and a bottom surface 102 opposite to the top surface 101. The substrate 10 includes glass, silicon, $SiO_2$, or a combination of two or more thereof. In some embodiments, the substrate 10 is formed of a glass material and a thickness of the substrate 10 is less than about 300 μm. In one or more embodiments, the thickness of the substrate 10 is in a range of about 10 μm to about 50 μm. In one or more embodiments, the thickness of the substrate 10 is in a range of about 50 μm to about 150 μm. A conductive layer 94 is formed within the substrate 10. In one or more embodiments, the conductive layer 94 may be a conductive pad 94. In one or more embodiments, the conductive layer 94 includes, for example, Cu, or other metal, or a metal alloy, or other conductive material.

Figure 2B:
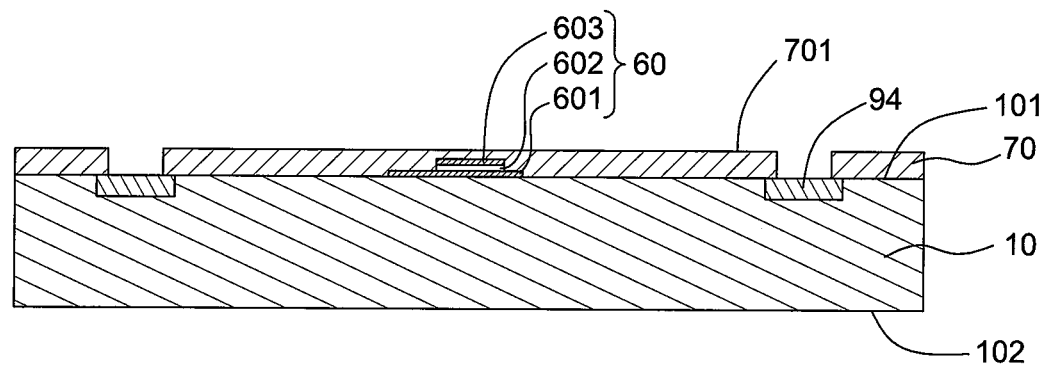

Referring to FIG. 2B, a capacitor 60 and a passivation layer 70 are disposed or formed on the top surface 101 of the substrate 10. The capacitor 60 includes a top electrode 603, a bottom electrode 601 and a dielectric layer 602 between the top electrode 603 and the bottom electrode 601. In one or more embodiments, the electrodes 601 and 603 include, for example, Cu, or other metal, or a metal alloy, or other conductive material. The dielectric layer 602 includes $SiN_x$, $Ta_2O_5$, TiO or other suitable materials. In one or more embodiments, the bottom electrode 601 contacts the substrate 10.

Figure 2C:
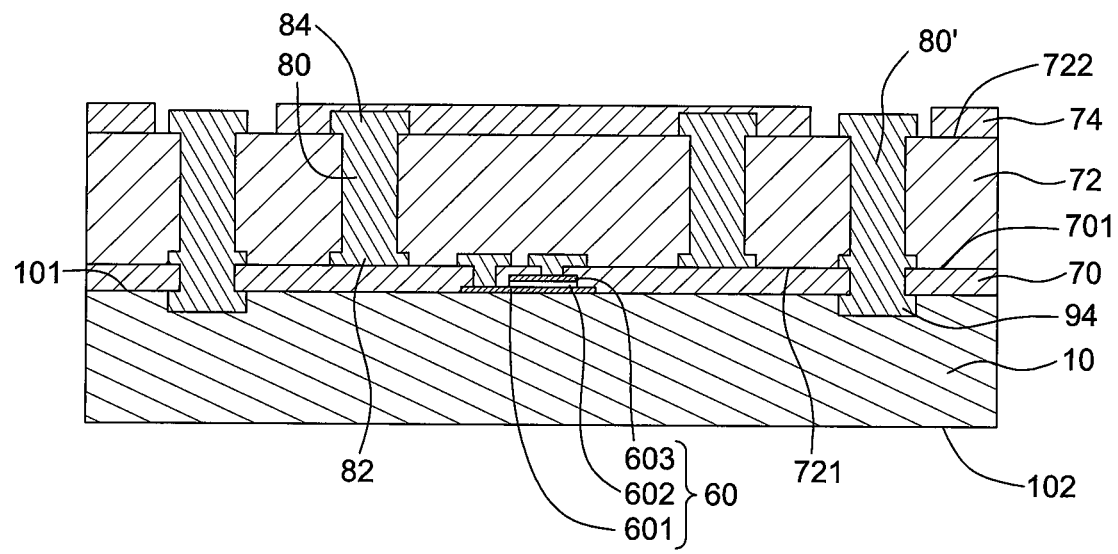
Figure 2D:
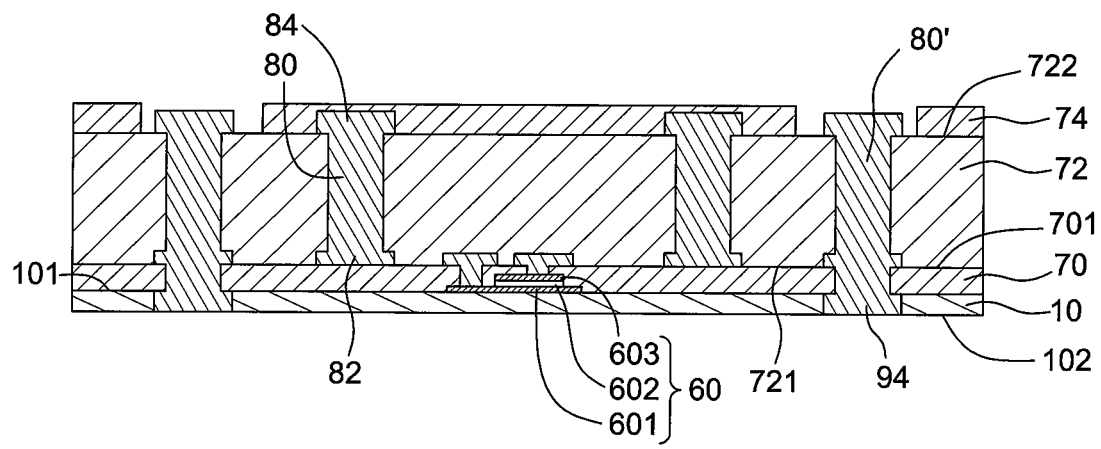

Referring to FIG. 2C, an insulation layer 72 is disposed or formed on a surface 701 of the passivation layer 70. In one or more embodiments, the insulation layer 72 is a wafer-level packaging PI film or an organic polymer film. The passivation layer (or lower passivation layer) 70 is disposed between conductive pillars 80 and the substrate 10. Metal strips 82 are formed on the surface 701 of the passivation layer 70. The conductive pillars 80 and metal strips 84 are formed on the metal strips 82. Each of the conductive pillars 80 penetrates the insulation layer 72 and connects the corresponding metal strip 82 and the corresponding metal strip 84. The metal strips 84 are formed on a top surface 722 of the insulation layer 72. Conductive pillars 80' are formed on the conductive layer 94 and penetrate the insulation layer 72. The insulation layer 72 surrounds the conductive pillars 80 and the conductive pillars 80'. A passivation layer (or upper passivation layer) 74 is disposed or formed to cover the metal strips 84 and the surface 722 of the insulation layer 72 and exposes the conductive pillars 80'. Referring to FIG. 2D, the substrate 10 is thinned by a backside grinding process. The conductive layer 94 is exposed after the backside grinding process.

Figure 2E:
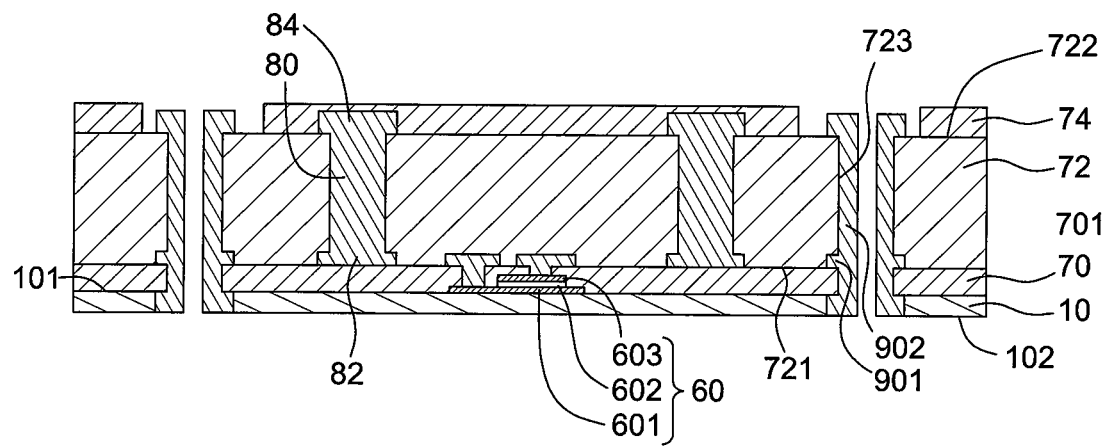

Referring to FIG. 2E, the conductive pillars 80' are sawed by sawing or other material removal technique. A first portion 901 and a second portion 902 are formed after sawing. The first portion 901 and the second portion 902 contact a surface 721 of the insulation layer 72, the surface 722 of the insulation layer 72 and a side surface 723 of the insulation layer 72. Next, a pre-solder layer 40 (see FIG. 1) is formed on the first portion 901 and the second portion 902 by a dipping process. External contacts 90 are formed after sawing the conductive pillars 80'. In one or more embodiments, the pre-solder layer 40 includes, for example, Sn, Ag, SnAg, or other metal or alloy, or other conductive material. After the dipping process, one unit of the integrated passive component 1 of FIG. 1 is obtained.

Figure 3:
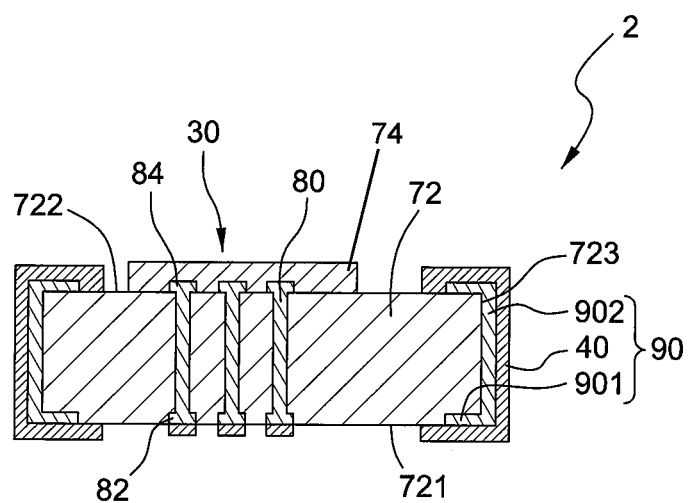
FIG. 3 is a cross-sectional view of an integrated passive component in accordance with some embodiments of the present disclosure.

FIG. 3 is a cross-sectional view of an integrated passive component 2 in accordance with some embodiments of the present disclosure. The integrated passive component 2 is similar in some ways to the integrated passive component 1 depicted in FIG. 1, and some same-numbered components are not described again with respect to FIG. 3. In the integrated passive component 2, the substrate 10 is not included. The integrated passive component 2 includes a passivation layer 74, an inductor 30, an insulation layer 72, metal strips 82 and 84, conductive pillars 80 and an external contact 90. The insulation layer 72 may be also a support layer.

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 84 are disposed on a surface 722 of the insulation layer 72. In one or more embodiments, the insulation layer 72 is a wafer-level packaging PI film or an organic polymer film. The external contact 90 is electrically connected to the inductor 30. The external contact 90 contacts a surface 721 of the insulation layer 72, the surface 722 of the insulation layer 72 and a side surface 723 of the insulation layer 72. The external contact 90 includes a first portion 901 and a second portion 902. In one or more embodiments, the first portion 901 and the second portion 902 include, for example, Cu, or other metal, or a metal alloy, or other conductive material. The first portion 901 contacts a portion of the surface 721 of the insulation layer 72. The second portion 902 contacts a portion of the surface 722 of insulation layer 72 and the side surface 723 of insulation layer 72. A pre-solder layer 40 contacts the surface 721 of the insulation layer 72. The pre-solder layer 40 contacts or is electrically connected to the metal strips 82. The pre-solder layer 40 is disposed on the first portion 901 and the second portion 902.

Figure 4A:
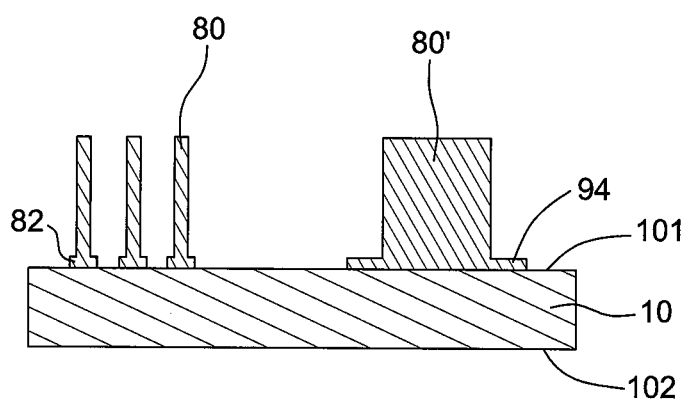
FIG. 4A, FIG. 4B, FIG. 4C, and FIG. 4D illustrate a method for manufacturing the integrated passive component of FIG. 3 in accordance with some embodiments.

FIG. 4A, FIG. 4B, FIG. 4C, and FIG. 4D illustrate a method for manufacturing an integrated passive component 2 of FIG. 3 in accordance with some embodiments. Referring to FIG. 4A, a substrate 10 is provided. The substrate 10 has a top surface 101 and a bottom surface 102 opposite to the top surface 101. The substrate 10 includes glass, silicon, $SiO_2$, or a combination of two or more thereof. In some embodiments, the substrate 10 is formed of a glass material and a thickness of the substrate 10 is about 450 μm to about 550 μm. Conductive pillars 80 and 80', a conductive layer 94 and metal strips 82 are formed on the surface 101 of the substrate 10. The conductive layer 94 is formed prior to forming the conductive pillars 80'. In one or more embodiments, the conductive pillars 80 and 80', the conductive layer 94 and the metal strips 82 include, for example, Cu, or other metal, or a metal alloy, or other conductive material.

Figure 4B:
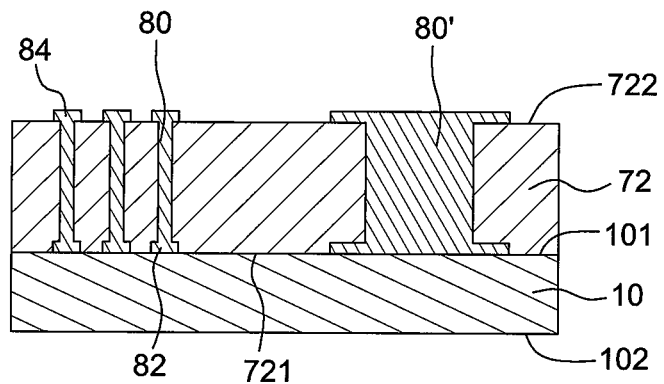

Referring to FIG. 4B, an insulation layer 72 is formed on the surface 101 of the substrate 10. Metal strips 84 are formed on a surface 722 of the insulation layer 72. In one or more embodiments, the insulation layer 72 is a wafer-level packaging PI film or an organic polymer film. The metal strips 84 are formed on the conductive pillars 80. Each of the conductive pillars 80 penetrates the insulation layer 72 and connects the corresponding metal strip 82 and the corresponding metal strip 84.

Figure 4C:
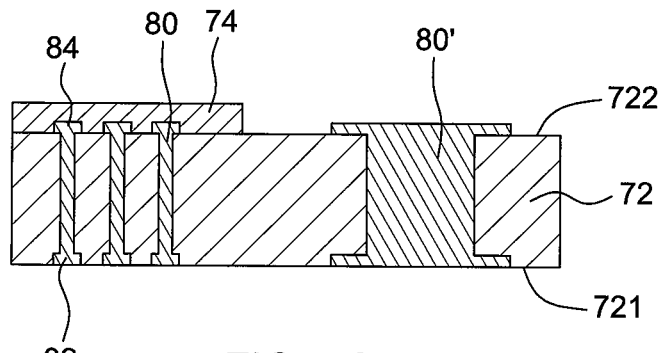

Referring to FIG. 4C, the substrate 10 is removed by a backside grinding process. After the backside grinding process, the metal strips 82 are exposed from a surface 721 of the insulation layer 72. The conductive pillars 80' are exposed from the surfaces 721 and 722 of the insulation layer 72. The metal strips 84 are covered by a passivation layer 74.

Figure 4D:
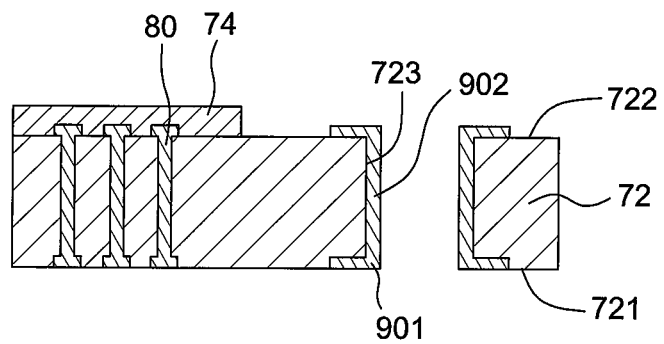

Referring to FIG. 4D, the conductive pillars 80' are sawed by sawing or other material removal technique. A first portion 901 and a second portion 902 are formed after sawing. The first portion 901 and the second portion 902 contact a portion of the surface 721 of the insulation layer 72, a portion of the surface 722 of the insulation layer 72 and a side surface 723 of the insulation layer 72.

Next, a pre-solder layer 40 (see FIG. 3) is formed on the first portion 901, the second portion 902 and the metal strips 82 by a dipping process. In one or more embodiments, the pre-solder layer 40 includes, for example, Sn, Ag, SnAg, or other metal or alloy, or other conductive material. After the dipping process, one unit of the integrated passive component 2 of FIG. 3 is obtained.

Figure 5:
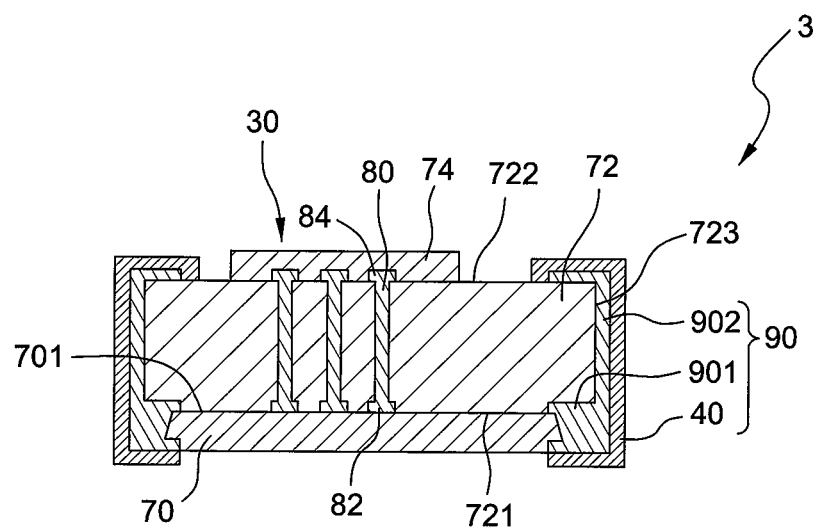
FIG. 5 is a cross-sectional view of an integrated passive component in accordance with some embodiments of the present disclosure.

FIG. 5 is a cross-sectional view of an integrated passive component 3 in accordance with some embodiments of the present disclosure. The integrated passive component 3 is similar in some ways to the integrated passive component 1 depicted in FIG. 1, and some same-numbered components are not described again with respect to FIG. 5. In the integrated passive component 3, the substrate 10 is not included. The integrated passive component 3 includes passivation layers 70 and 74, an inductor 30, an insulation layer 72, metal strips 82 and 84, conductive pillars 80 and an external contact 90. The insulation layer 72 may be also a support layer.

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 82 are disposed on a surface 701 and multiple metal strips 84 are disposed on a surface 722. In one or more embodiments, the insulation layer 72 is a wafer-level packaging PI film or an organic polymer film. The external contact 90 is electrically connected to the inductor 30. The external contact 90 contacts a portion of a surface 721 of the insulation layer 72, a portion of the surface 722 of the insulation layer 72 and a side surface 723 of the insulation layer 72. The external contact 90 includes a first portion 901, a second portion 902 and a pre-solder layer 40. In one or more embodiments, the first portion 901 and the second portion 902 include, for example, Cu, or other metal, or a metal alloy, or other conductive material. The first portion 901 contacts a portion of the surface 721 of the insulation layer 72. The second portion 902 contacts a portion of the surface 722 of the insulation layer 72 and the side surface 723 of the insulation layer 72.

Figure 6A:
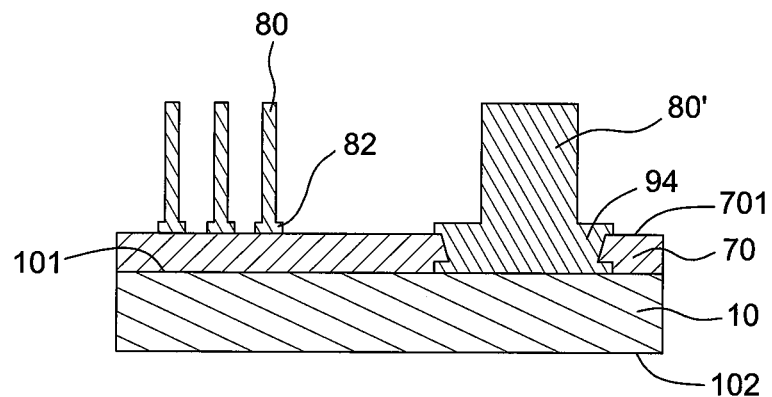
FIG. 6A, FIG. 6B, FIG. 6C, and FIG. 6D illustrate a method for manufacturing the integrated passive component of FIG. 5 in accordance with some embodiments.
Figure 6B:
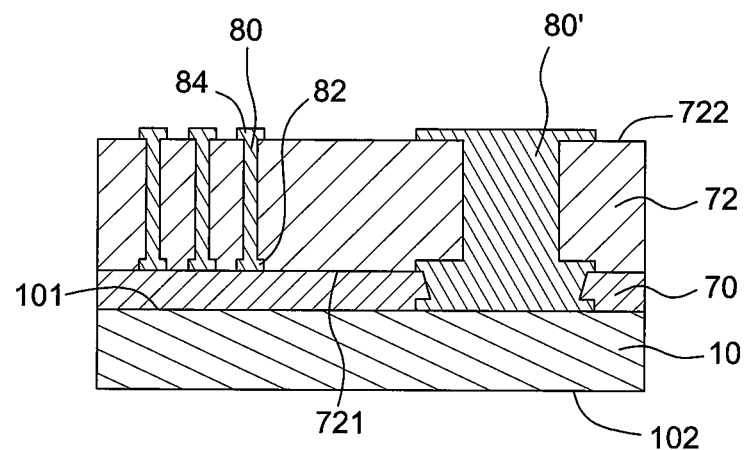

FIG. 6A, FIG. 6B, FIG. 6C, and FIG. 6D illustrate a method for manufacturing an integrated passive component 3 of FIG. 5 in accordance with some embodiments. Referring to FIG. 6A, a substrate 10 is provided. The substrate 10 has a top surface 101 and a bottom surface 102 opposite to the top surface 101. The substrate 10 includes glass, silicon, SiO$_2$, or a combination of two or more thereof. In some embodiments, the substrate 10 is formed of a glass material and a thickness of the substrate 10 is about 450 μm to about 550 μm. Conductive pillars 80 and 80', a conductive layer 94 and metal strips 82 are formed on the surface 101 of the substrate 10. In one or more embodiments, the conductive pillars 80 and 80', the conductive layer 94 and the metal strips 82 include, for example, Cu, or other metal, or a metal alloy, or other conductive material.

Still referring to FIG. 6A, a passivation layer 70 is formed on the surface 101 of the substrate 10. Next and referring to FIG. 6B, an insulation layer 72 is formed on the passivation layer 70. Metal strips 84 are formed on a surface 722 of the insulation layer 72. In one or more embodiments, the insulation layer 72 is a wafer-level packaging PI film or an organic polymer film. The metal strips 84 are formed on the conductive pillars 80. Each of the conductive pillars 80 penetrates the insulation layer 72 and connects the corresponding metal strip 82 and the corresponding metal strip 84.

Figure 6C:
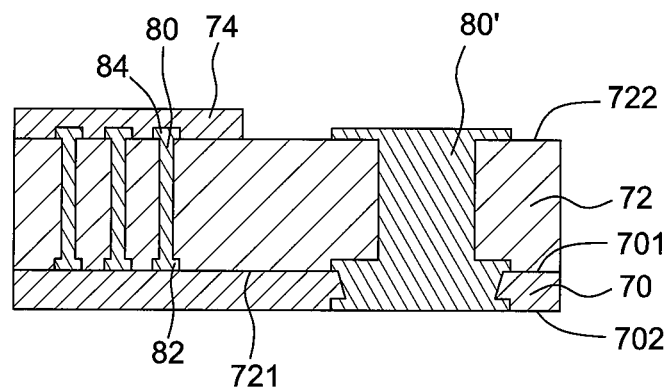

Referring to FIG. 6C, the substrate 10 is removed by a backside grinding process. After the backside grinding process, the conductive pillars 80' are exposed from a surface 702 of the passivation layer 70. The metal strips 84 are covered by a passivation layer 74.

Figure 6D:
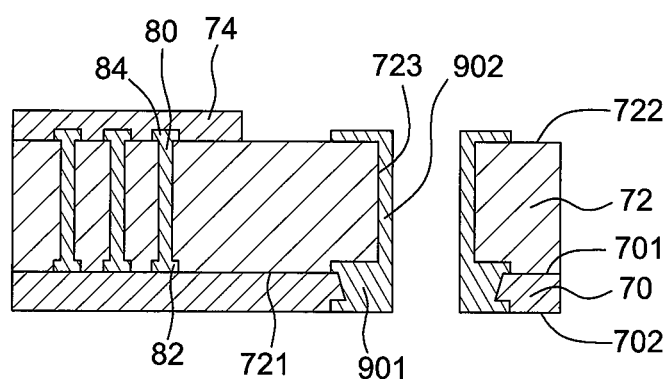

Referring to FIG. 6D, the conductive pillars 80' are sawed by sawing or other material removal technique. A first portion 901 and a second portion 902 are formed after sawing. The first portion 901 and the second portion 902 contact a portion of a surface 721 of the insulation layer 72, a portion of the surface 722 of the insulation layer 72 and a side surface 723 of the insulation layer 72.

Next, a pre-solder layer 40 (see FIG. 5) is formed on the first portion 901 and the second portion 902 by a dipping process. In one or more embodiments, the pre-solder layer 40 includes, for example, Sn, Ag, SnAg, or other metal or alloy, or other conductive material. After the dipping process, one unit of the integrated passive component 3 of FIG. 5 is obtained.

Figure 7:
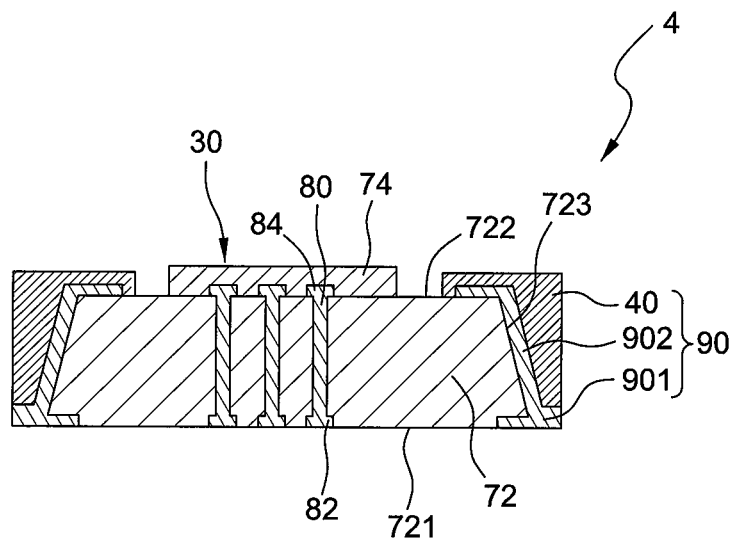
FIG. 7 is a cross-sectional view of an integrated passive component in accordance with some embodiments of the present disclosure.

FIG. 7 is a cross-sectional view of an integrated passive component 4 in accordance with some embodiments of the present disclosure. The integrated passive component 4 is similar in some ways to the integrated passive component 1 depicted in FIG. 1, and some same-numbered components are not described again with respect to FIG. 7. In the integrated passive component 4, the substrate 10 is not included. The integrated passive component 4 includes a passivation layer 74, an inductor 30, an insulation layer 72, metal strips 82 and 84, conductive pillars 80 and an external contact 90. The insulation layer 72 may be also a support layer.

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 84 are disposed on a surface 722. In one or more embodiments, the insulation layer 72 is a wafer-level packaging PI film or an organic polymer film. The external contact 90 is electrically connected to the inductor 30. The external contact 90 contacts a portion of a surface 721 of the insulation layer 72, a portion of the surface 722 of the insulation layer 72 and a side surface 723 of the insulation layer 72. The side surface 723 of the insulation layer 72 forms an acute angle with respect to the surface 721 of the insulation layer 72, such as about 85 degrees or less or about 80 degrees or less. The external contact 90 includes a first portion 901, a second portion 902, and a pre-solder layer 40. In one or more embodiments, the first portion 901 and the second portion 902 include, for example, Cu, or other metal, or a metal alloy, or other conductive material. The first portion 901 contacts a portion of the surface 721 of the insulation layer 72. The second portion 902 contacts a portion of the surface 722 of insulation layer 72 and the side surface 723 of insulation layer 72. The pre-solder layer 40 contacts the surface 722 of insulation layer 72.

Figure 8:
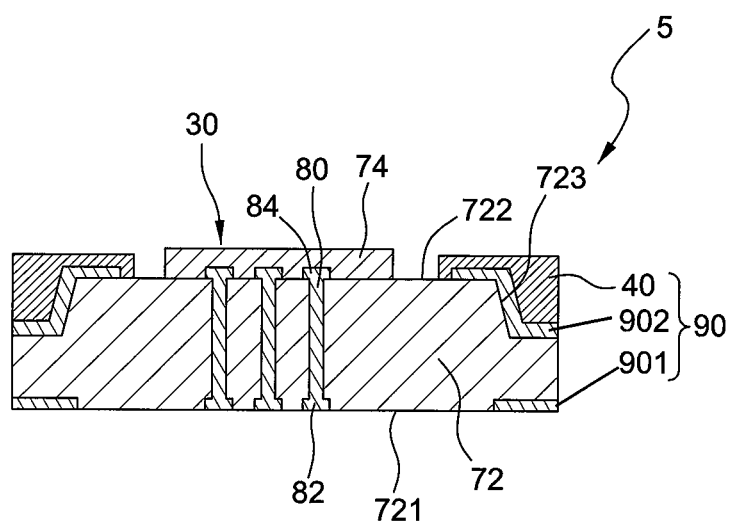
FIG. 8 is a cross-sectional view of an integrated passive component in accordance with some embodiments of the present disclosure.

FIG. 8 is a cross-sectional view of an integrated passive component 5 in accordance with some embodiments of the present disclosure. The integrated passive component 5 is similar in some ways to the integrated passive component 1 depicted in FIG. 1, and some same-numbered components are not described again with respect to FIG. 8. In the integrated passive component 5, the substrate 10 is not included. The integrated passive component 5 includes a passivation layer 74, an inductor 30, an insulation layer 72, metal strips 82 and 84, conductive pillars 80 and an external contact 90. The insulation layer 72 may be also a support layer.

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 84 are disposed on a surface 722. In one or more embodiments, the insulation layer 72 is a wafer-level packaging PI film or an organic polymer film. The external contact 90 is electrically connected to the inductor 30. The external contact 90 contacts a portion of a surface 721 of the insulation layer 72, a portion of the surface 722 of the insulation layer 72 and a portion of a side surface 723 of the insulation layer 72. The external contact 90 includes a first portion 901, a second portion 902, and a pre-solder layer 40. In one or more embodiments, the first portion 901 and second portion 902 include, for example, Cu, or other metal, or a metal alloy, or other conductive material. The first portion 901 contacts a portion of the surface 721 of the insulation layer 72. The second portion 902 contacts a portion of the surface 722 of insulation layer 72 and a portion of the side surface 723 of insulation layer 72. The first portion 901 is isolated or spaced apart from the second portion 902 and a portion of the side surface 723 of the insulation layer 72 is exposed. The pre-solder layer 40 is disposed on the second portion 902 and contacts the surface 722 of the insulation layer 72.

Figure 9A:
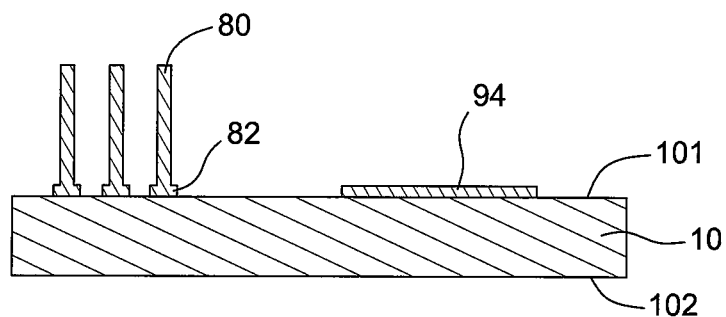
FIG. 9A, FIG. 9B, and FIG. 9C illustrate a method for manufacturing the integrated passive component of FIG. 7 in accordance with some embodiments.
Figure 9B:
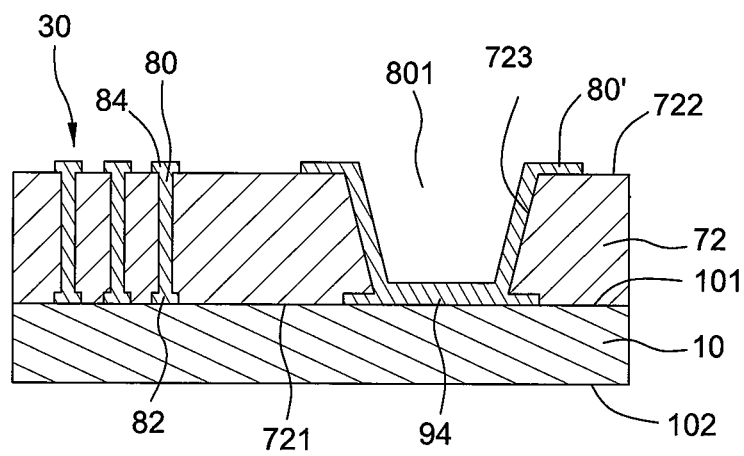
Figure 9C:
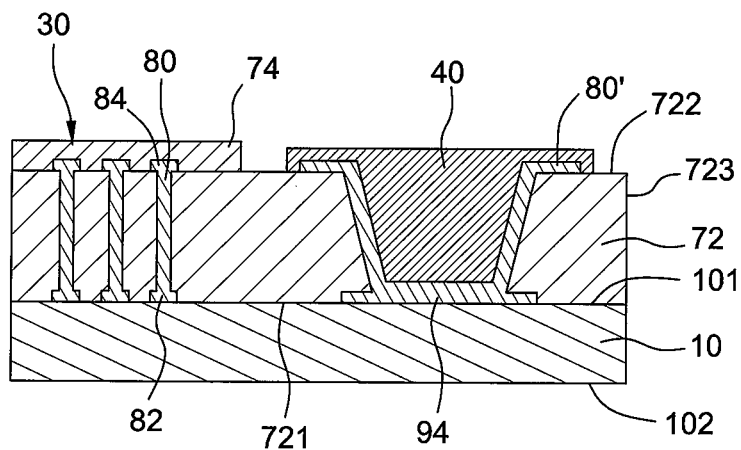

FIG. 9A, FIG. 9B, and FIG. 9C illustrate a method for manufacturing an integrated passive component 4 of FIG. 7 in accordance with some embodiments. Referring to FIG. 9A, a substrate 10 is provided. The substrate 10 has a top surface 101 and a bottom surface 102 opposite to the top surface 101. The substrate 10 includes glass, silicon, $SiO_2$, or a combination of two or more thereof. In some embodiments, the substrate 10 is formed of a glass material and a thickness of the substrate 10 is less than about 300 μm. In one or more embodiments, the thickness of the substrate 10 is in a range of about 10 μm to about 50 μm. In one or more embodiments, the thickness of the substrate 10 is in a range of about 50 μm to about 150 μm. Conductive pillars 80, a conductive layer 94 and metal strips 82 are formed on the surface 101 of the substrate 10. In one or more embodiments, the conductive pillars 80, the conductive layer 94 and the metal strips 82 include, for example, Cu, or other metal, or a metal alloy, or other conductive material.

Referring to FIG. 9B, an insulation layer 72 is formed on the surface 101 of the substrate 10. Metal strips 84 are formed on a surface 722 of the insulation layer 72. In one or more embodiments, the insulation layer 72 is a wafer-level packaging PI film or an organic polymer film. The metal strips 84 are formed on the conductive pillars 80. Each of the conductive pillars 80 penetrates the insulation layer 72 and connects the corresponding metal strip 82 and the corresponding metal strip 84. A via opening 801 is formed in the insulation layer 72 to accommodate a conductive pillar 80'. The conductive pillar 80' is formed on the conductive layer 94 which is exposed by the via opening 801.

Referring to FIG. 9C, a pre-solder layer 40 is formed on the conductive pillar 80' by a dipping process. In one or more embodiments, the pre-solder layer 40 includes, for example, Sn, Ag, SnAg, or other metal or alloy, or other conductive material. A passivation layer 74 is formed to cover the metal strips 84. One unit of the integrated passive component 4 of FIG. 7 is obtained after the conductive pillar 80', the pre-solder layer 40 and the substrate 10 are sawed by sawing or other material removal technique.

Figure 10A:
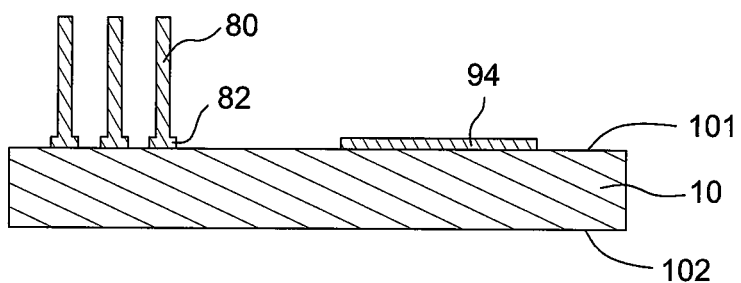
FIG. 10A, FIG. 10B, and FIG. 10C illustrate a method for manufacturing the integrated passive component of FIG. 8 in accordance with some embodiments.
Figure 10B:
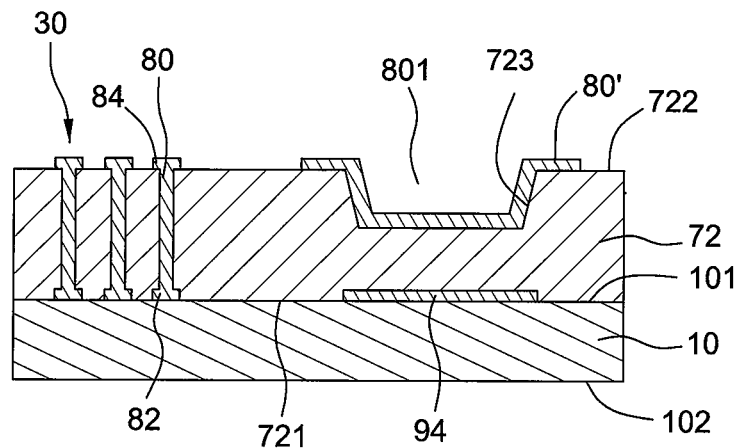
Figure 10C:
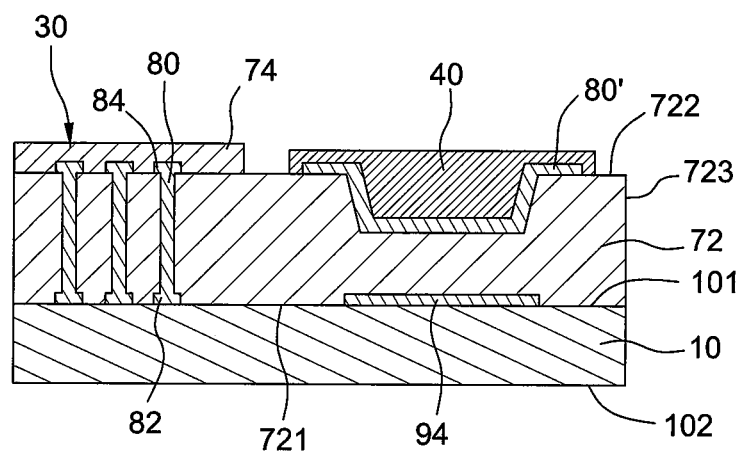

FIG. 10A, FIG. 10B, and FIG. 10C illustrate a method for manufacturing an integrated passive component 5 of FIG. 8 in accordance with some embodiments. Referring to FIG. 10A, a substrate 10 is provided. The substrate 10 has a top surface 101 and a bottom surface 102 opposite to the top surface 101. The substrate 10 includes glass, silicon, $SiO_2$, or a combination of two or more thereof. In some embodiments, the substrate 10 is formed of a glass material and a thickness of the substrate 10 is about 450 μm to about 550 μm. Conductive pillars 80, a conductive layer 94 and metal strips 82 are formed on the surface 101 of the substrate 10. In one or more embodiments, the conductive pillars 80, the conductive layer 94 and the metal strips 82 include, for example, Cu, or other metal, or a metal alloy, or other conductive material.

Referring to FIG. 10B, an insulation layer 72 is formed on the surface 101 of the substrate 10. Metal strips 84 are formed on a surface 722 of the insulation layer 72. In one or more embodiments, the insulation layer 72 is a wafer-level packaging PI film or an organic polymer film. The metal strips 84 are formed on the conductive pillars 80. Each of the conductive pillars 80 penetrates the insulation layer 72 and connects the corresponding metal strip 82 and the corresponding metal strip 84. A via opening 801 is formed in the insulation layer 72 to accommodate a conductive pillar 80', but without exposing the conductive layer 94. The conductive pillar 80' is formed over the conductive layer 94 and separated from the conductive layer 94.

Referring to FIG. 10C, a pre-solder layer 40 is formed on the conductive pillar 80' by a dipping process. In one or more embodiments, the pre-solder layer 40 includes, for example, Sn, Ag, SnAg, or other metal or alloy, or other conductive material. A passivation layer 74 is formed to cover the metal strips 84. One unit of the integrated passive component 5 of FIG. 8 is obtained after the conductive pillar 80', the pre-solder layer 40 and the substrate 10 are sawed by sawing or other material removal technique. After sawing, the external contact 90 (see FIG. 8), which includes a first portion 901, a second portion 902 and a pre-solder layer 40, is formed. The first portion 901 is isolated from the second portion 902.

Figure 11:
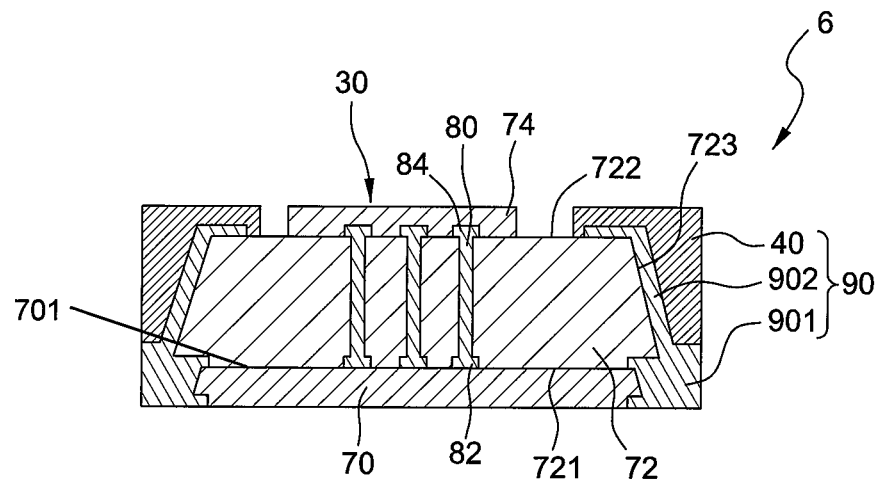
FIG. 11 is a cross-sectional view of an integrated passive component in accordance with some embodiments of the present disclosure.

FIG. 11 is a cross-sectional view of an integrated passive component 6 in accordance with some embodiments of the present disclosure. The integrated passive component 6 is similar in some ways to the integrated passive component 1 depicted in FIG. 1, and some same-numbered components are not described again with respect to FIG. 11. In the integrated passive component 6, the substrate 10 is not included. The integrated passive component 6 includes passivation layers 70 and 74, an inductor 30, an insulation layer 72, metal strips 82 and 84, conductive pillars 80 and an external contact 90. The insulation layer 72 may be also a support layer.

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 82 are disposed on a surface 701 and multiple metal strips 84 are disposed on a surface 722. In one or more embodiments, the insulation layer 72 is a wafer-level packaging PI film or an organic polymer film. The external contact 90 is electrically connected to the inductor 30. The external contact 90 contacts a portion of a surface 721 of the insulation layer 72, a portion of the surface 722 of the insulation layer 72 and a side surface 723 of the insulation layer 72. The side surface 723 of the insulation layer 72 forms an acute angle with respect to the surface 721 of the insulation layer 72, such as about 85 degrees or less or about 80 degrees or less. The external contact 90 includes a first portion 901, a second portion 902 and a pre-solder layer 40. In one or more embodiments, the first portion 901 and the second portion 902 include, for example, Cu, or other metal, or a metal alloy, or other conductive material. The first portion 901 contacts a portion of the surface 721 of the insulation layer 72. The second portion 902 contacts a portion of the surface 722 of the insulation layer 72 and the side surface 723 of the insulation layer 72.

Figure 12:
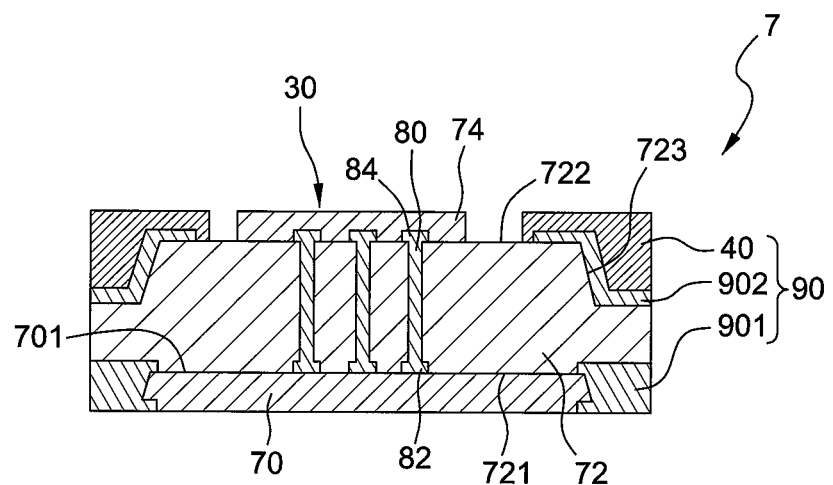
FIG. 12 is a cross-sectional view of an integrated passive component in accordance with some embodiments of the present disclosure.

FIG. 12 is a cross-sectional view of an integrated passive component 7 in accordance with some embodiments of the present disclosure. The integrated passive component 7 is similar in some ways to the integrated passive component 1 depicted in FIG. 1, and some same-numbered components are not described again with respect to FIG. 12. In the integrated passive component 7, the substrate 10 is not included. The integrated passive component 7 includes passivation layers 70 and 74, an inductor 30, an insulation layer 72, metal strips 82 and 84, conductive pillars 80 and an external contact 90. The insulation layer 72 may be also a support layer.

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 82 are disposed on a surface 701 and multiple metal strips 84 are disposed on a surface 722. In one or more embodiments, the insulation layer 72 is a wafer-level packaging PI film or an organic polymer film. The external contact 90 is electrically connected to the inductor 30. The external contact 90 contacts a portion of a surface 721 of the insulation layer 72, a portion of the surface 722 of the insulation layer 72 and a portion of a side surface 723 of the insulation layer 72. The external contact 90 includes a first portion 901, a second portion 902 and a pre-solder layer 40. The first portion 901 is isolated or spaced apart from the second portion 902. The pre-solder layer 40 is disposed on the second portion 902. In one or more embodiments, the first portion 901 and second portion 902 include, for example, Cu, or other metal, or a metal alloy, or other conductive material. The first portion 901 contacts a portion of the surface 721 of the insulation layer 72. The second portion 902 contacts a portion of the surface 722 of the insulation layer 72 and a portion of the side surface 723 of the insulation layer 72.

Figure 13A:
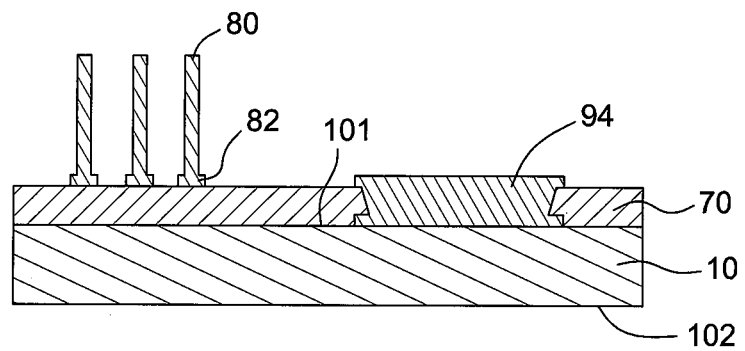
FIG. 13A, FIG. 13B, and FIG. 13C illustrate a method for manufacturing the integrated passive component of FIG. 11 in accordance with some embodiments.
Figure 13B:
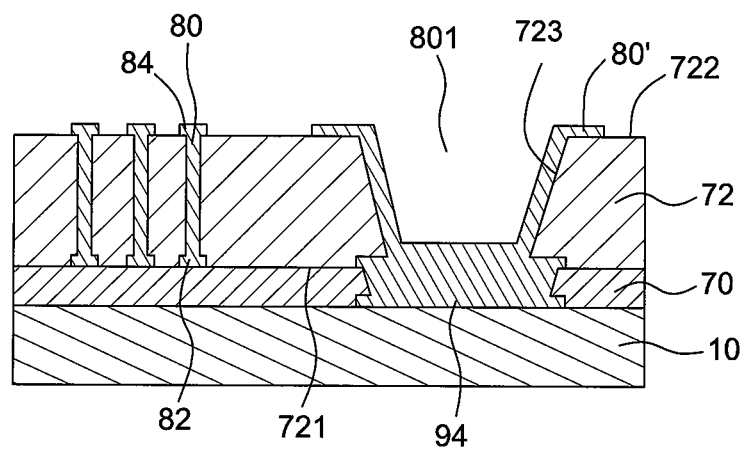
Figure 13C:
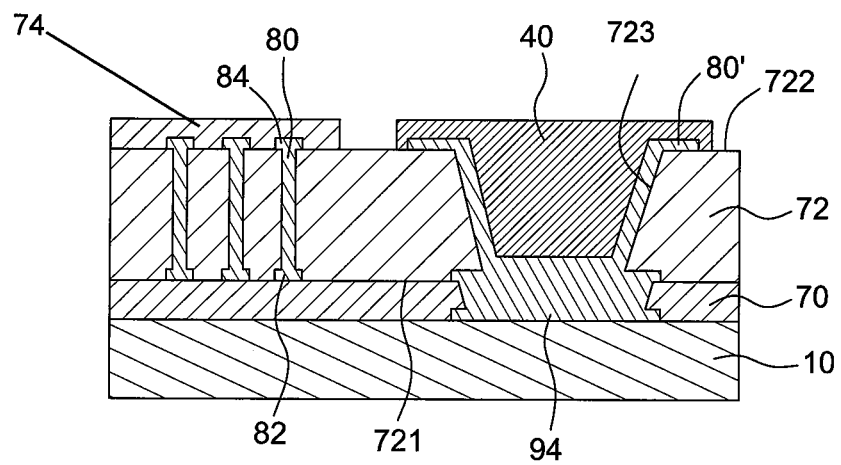

FIG. 13A, FIG. 13B, and FIG. 13C illustrate a method for manufacturing an integrated passive component 6 of FIG. 11 in accordance with some embodiments. Referring to FIG. 13A, a substrate 10 is provided. The substrate 10 has a top surface 101 and a bottom surface 102 opposite to the top surface 101. The substrate 10 includes glass, silicon, SiO$_2$, or a combination of two or more thereof. In some embodiments, the substrate 10 is formed of a glass material and a thickness of the substrate 10 is about 450 µm to about 550 µm. A passivation layer 70 is formed on the substrate 10. Conductive pillars 80 and metal strips 82 are formed on the passivation layer 70. A conductive layer 94 is formed on the surface 101 of the substrate 10. In one or more embodiments, the conductive pillars 80, the conductive layer 94 and the metal strips 82 include, for example, Cu, or other metal, or a metal alloy, or other conductive material.

Referring to FIG. 13B, an insulation layer 72 is formed on the passivation layer 70. Metal strips 84 are formed on a surface 722 of the insulation layer 72. In one or more embodiments, the insulation layer 72 is a wafer-level packaging PI film or an organic polymer film. The metal strips 84 are formed on the conductive pillars 80. Each of the conductive pillars 80 penetrates the insulation layer 72 and connects the corresponding metal strip 82 and the corresponding metal strip 84. A via opening 801 is formed in the insulation layer 72 to accommodate a conductive pillar 80'. The conductive pillar 80' is formed on the conductive layer 94 which is exposed by the via opening 801.

Referring to FIG. 13C, a pre-solder layer 40 is formed on the conductive pillar 80' by a dipping process. In one or more embodiments, the pre-solder layer 40 includes, for example, Sn, Ag, SnAg, or other metal or alloy, or other conductive material. A passivation layer 74 is formed to cover the metal strips 84. One unit of the integrated passive component 6 of FIG. 11 is obtained after the conductive pillar 80', the pre-solder layer 40 and the substrate 10 are sawed by sawing or other material removal technique.

Figure 14A:
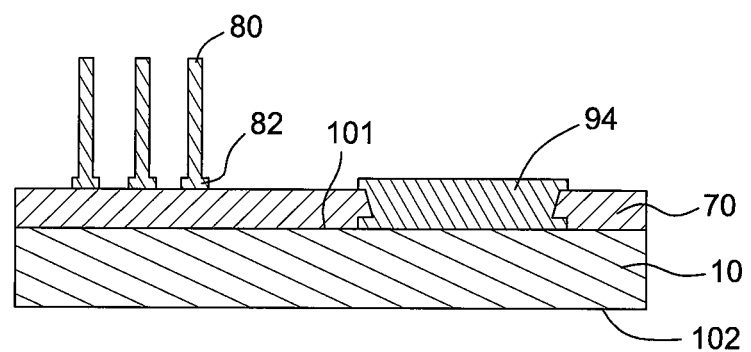
FIG. 14A, FIG. 14B, and FIG. 14C illustrate a method for manufacturing the integrated passive component of FIG. 12 in accordance with some embodiments.
Figure 14B:
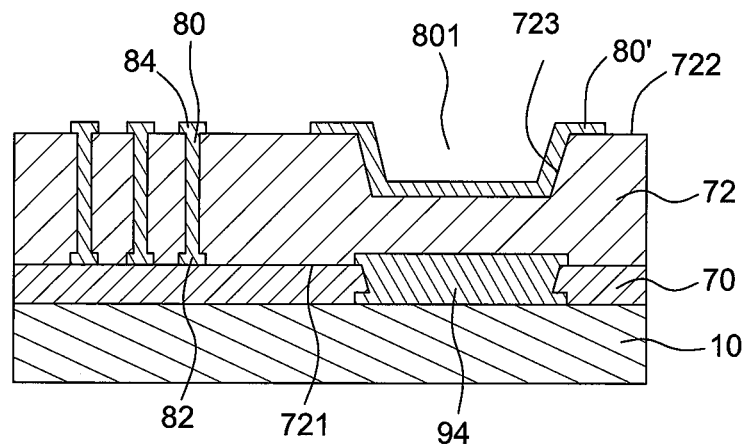
Figure 14C:
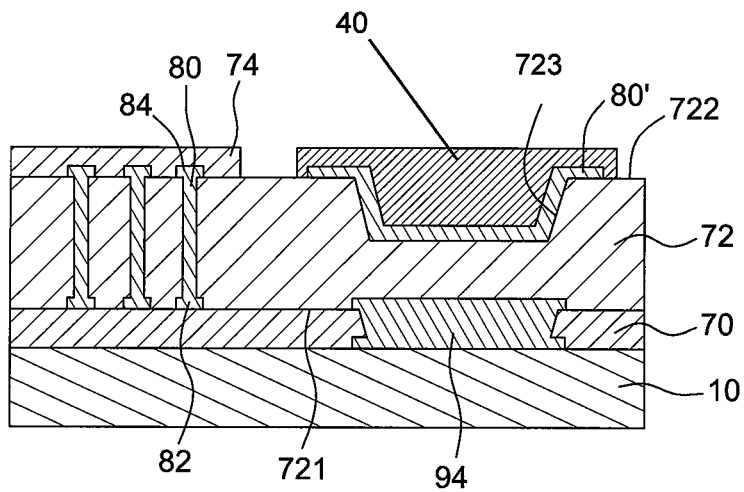

FIG. 14A, FIG. 14B, and FIG. 14C illustrate a method for manufacturing an integrated passive component 7 of FIG. 12 in accordance with some embodiments. Referring to FIG. 14A, a substrate 10 is provided. The substrate 10 has a top surface 101 and a bottom surface 102 opposite to the top surface 101. The substrate 10 includes glass, silicon, SiO$_2$, or a combination of two or more thereof. In some embodiments, the substrate 10 is formed of a glass material and a thickness of the substrate 10 is about 450 µm to about 550 µm. A passivation layer 70 is formed on the substrate 10. Conductive pillars 80 and metal strips 82 are formed on the passivation layer 70. A conductive layer 94 is formed on the surface 101 of the substrate 10. In one or more embodiments, the conductive pillars 80, the conductive layer 94 and the metal strips 82 include, for example, Cu, or other metal, or a metal alloy, or other conductive material.

Referring to FIG. 14B, an insulation layer 72 is formed on the passivation layer 70. Metal strips 84 are formed on a surface 722 of the insulation layer 72. In one or more embodiments, the insulation layer 72 is a wafer-level packaging PI film or an organic polymer film. The metal strips 84 are formed on the conductive pillars 80. Each of the conductive pillars 80 penetrates the insulation layer 72 and connects the corresponding metal strip 82 and the corresponding metal strip 84. A via opening 801 is formed in the insulation layer 72 to accommodate a conductive pillar 80', but without exposing the conductive layer 94. The conductive pillar 80' is formed over the conductive layer 94. The conductive pillar 80' is separated from the conductive layer 94.

Referring to FIG. 14C, a pre-solder layer 40 is formed on the conductive pillar 80' by a dipping process. In one or more embodiments, the pre-solder layer 40 includes, for example, Sn, Ag, SnAg, or other metal or alloy, or other conductive material. A passivation layer 74 is formed to cover the metal strips 84. One unit of the integrated passive component 7 of FIG. 12 is obtained after the conductive pillar 80', the pre-solder layer 40, the insulation layer 72 and the substrate 10 are sawed by sawing or other material removal technique.

Figure 15:
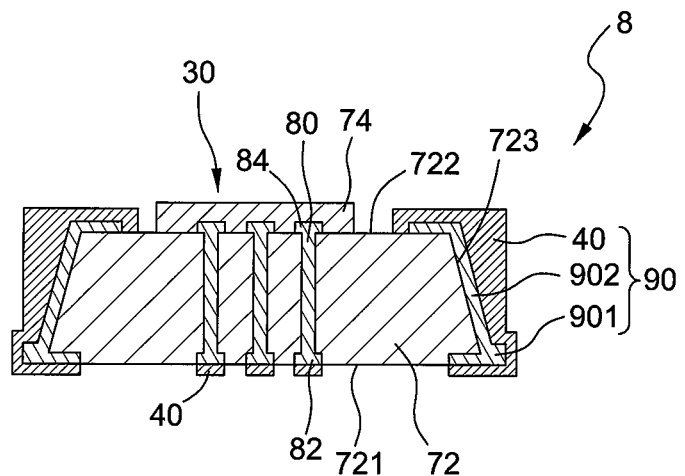
FIG. 15 is a cross-sectional view of an integrated passive component in accordance with some embodiments of the present disclosure.

FIG. 15 is a cross-sectional view of an integrated passive component 8 in accordance with some embodiments of the present disclosure. The integrated passive component 8 is similar in some ways to the integrated passive component 1 depicted in FIG. 1, and some same-numbered components are not described again with respect to FIG. 15. In the integrated passive component 8, the substrate 10 is not included. The integrated passive component 8 includes a passivation layer 74, an inductor 30, an insulation layer 72, metal strips 82 and 84, conductive pillars 80 and an external contact 90. The insulation layer 72 may be also a support layer.

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 84 are disposed on a surface 722. In one or more embodiments, the insulation layer 72 is a wafer-level packaging PI film or an organic polymer film. The external contact 90 is electrically connected to the inductor 30. The external contact 90 contacts a surface 721 of the insulation layer 72, the surface 722 of the insulation layer 72 and a side surface 723 of the insulation layer 72. The side surface 723 of the insulation layer 72 is not perpendicular to the surface 721 or 722 of the insulation layer 72, and forms an acute angle with respect to the surface 721. The external contact 90 includes a first portion 901 and a second portion 902. In one or more embodiments, the first portion 901 and the second portion 902 include, for example, Cu, or other metal, or a metal alloy, or other conductive material. The first portion 901 contacts a portion of the surface 721 of the insulation layer 72. The second portion 902 contacts a portion of the surface 722 of the insulation layer 72 and the side surface 723 of the insulation layer 72. The pre-solder layer 40 contacts or is electrically connected to the metal strips 82. The pre-solder layer 40 is disposed on the first portion 901 and the second portion 902.

Figure 16:
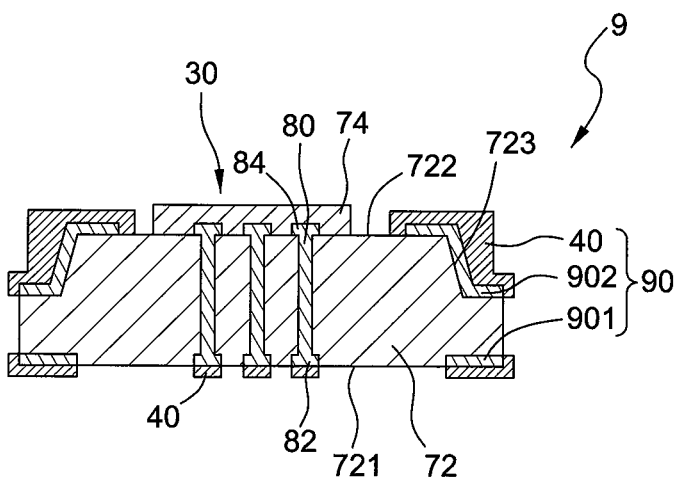
FIG. 16 is a cross-sectional view of an integrated passive component in accordance with some embodiments of the present disclosure.

FIG. 16 is a cross-sectional view of an integrated passive component 9 in accordance with some embodiments of the present disclosure. The integrated passive component 9 is similar in some ways to the integrated passive component 1 depicted in FIG. 1, and some same-numbered components are not described again with respect to FIG. 16. In the integrated passive component 9, the substrate 10 is not included. The integrated passive component 9 includes a passivation layer 74, an inductor 30, an insulation layer 72, metal strips 82 and 84, conductive pillars 80 and an external contact 90. The insulation layer 72 may be also a support layer.

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 84 are disposed on a surface 722. In one or more embodiments, the insulation layer 72 is a wafer-level packaging PI film or an organic polymer film. The external contact 90 is electrically connected to the inductor 30. The external contact 90 includes a first portion 901, a second portion 902 and a pre-solder layer 40. The first portion 901 is separated from the second portion 902. The pre-solder layer 40 is respectively disposed on the first portion 901 and the second portion 902. The external contact 90 contacts a surface 721 of the insulation layer 72, the surface 722 of the insulation layer 72 and a side surface 723 of the insulation layer 72. The side surface 723 of the insulation layer 72 is not perpendicular to the surface 721 or 722 of the insulation layer 72. In one or more embodiments, the first portion 901 and the second portion 902 include, for example, Cu, or other metal, or a metal alloy, or other conductive material. The first portion 901 contacts a portion of the surface 721 of the insulation layer 72. The second portion 902 contacts a portion of the surface 722 of insulation layer 72 and the side surface 723 of insulation layer 72. The pre-solder layer 40 contacts or is electrically connected to the metal strips 82.

Figure 17A:
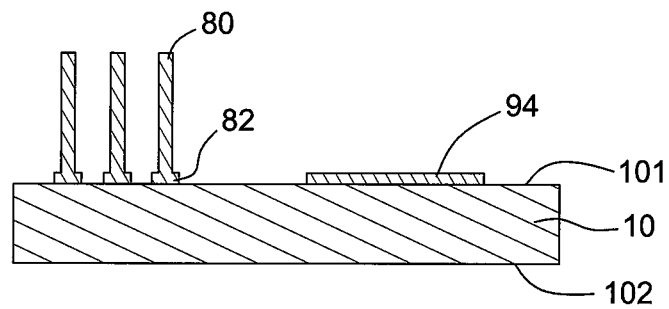
FIG. 17A, FIG. 17B, and FIG. 17C illustrate a method for manufacturing the integrated passive component of FIG. 15 in accordance with some embodiments.
Figure 17B:
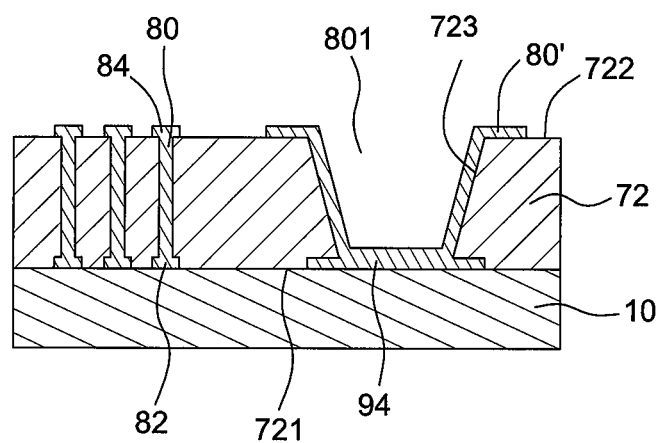
Figure 17C:
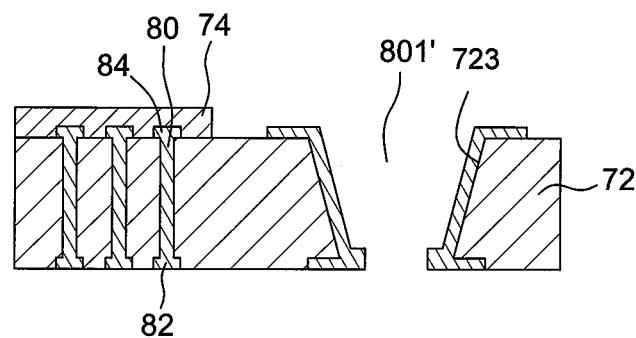

FIG. 17A, FIG. 17B, and FIG. 17C illustrate a method for manufacturing an integrated passive component 8 of FIG. 15 in accordance with some embodiments. Referring to FIG. 17A, a substrate 10 is provided. The substrate 10 has a top surface 101 and a bottom surface 102 opposite to the top surface 101. The substrate 10 includes glass, silicon, $SiO_2$, or a combination of two or more thereof. In some embodiments, the substrate 10 is formed of a glass material and a thickness of the substrate 10 is about 450 μm to about 550 μm. Conductive pillars 80, a conductive layer 94 and metal strips 82 are formed on the surface 101 of the substrate 10. In one or more embodiments, the conductive pillars 80, the conductive layer 94 and the metal strips 82 include, for example, Cu, or other metal, or a metal alloy, or other conductive material.

Referring to FIG. 17B, an insulation layer 72 is formed on the surface 101 of the substrate 10. Metal strips 84 are formed on a surface 722 of the insulation layer 72. In one or more embodiments, the insulation layer 72 is a wafer-level packaging PI film or an organic polymer film. The metal strips 84 are formed on the conductive pillars 80. Each of the conductive pillars 80 penetrates the insulation layer 72 and connects the corresponding metal strip 82 and the corresponding metal strip 84. A via opening 801 is formed in the insulation layer 72 to accommodate a conductive pillar 80'. The conductive pillar 80' is formed on the conductive layer 94 which is exposed by the via opening 801.

Referring to FIG. 17C, the substrate 10 is removed by a backside grinding process. A portion of the conductive layer 94 is removed to form a through-hole 801'. The through-hole 801' can accommodate the conductive pillar 80'. A pre-solder layer 40 (see FIG. 15) is formed on the conductive pillar 80' and the conductive layer 94 by a dipping process. In one or more embodiments, the pre-solder layer 40 includes, for example, Sn, Ag, SnAg, or other metal or alloy, or other conductive material. A passivation layer 74 is formed to cover the metal strips 84. One unit of the integrated passive component 8 of FIG. 15 is obtained after sawing or other material removal technique.

Figure 18A:
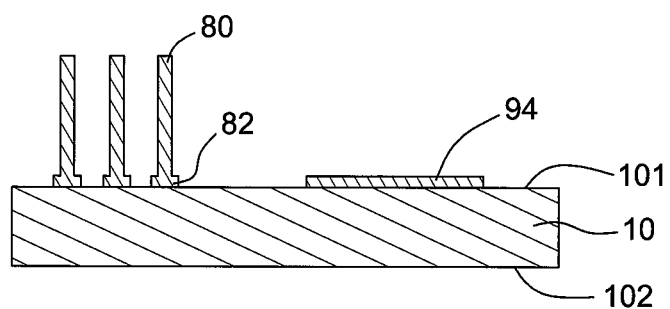
FIG. 18A, FIG. 18B, and FIG. 18C illustrate a method for manufacturing the integrated passive component of FIG. 16 in accordance with some embodiments.
Figure 18B:
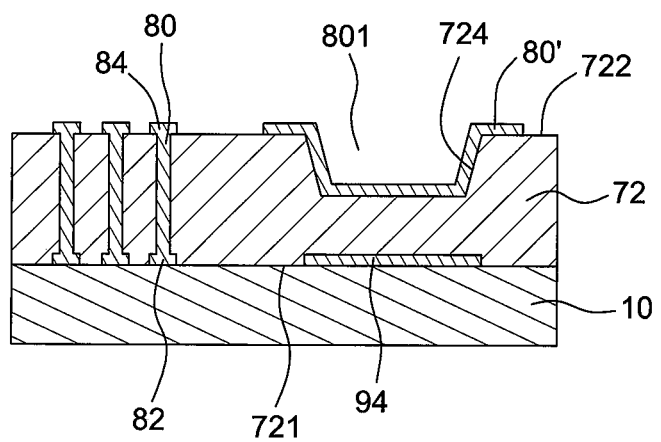
Figure 18C:
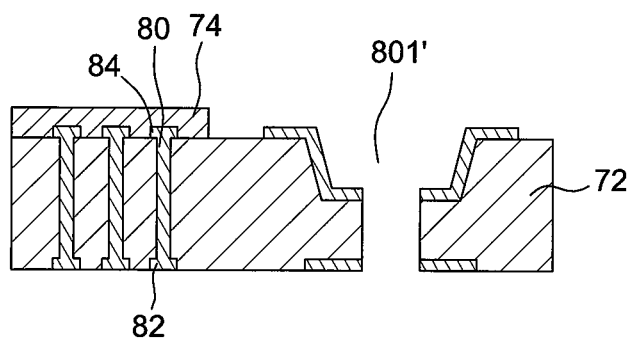

FIG. 18A, FIG. 18B, and FIG. 18C illustrate a method for manufacturing an integrated passive component 9 of FIG. 16 in accordance with some embodiments. Referring to FIG. 18A, a substrate 10 is provided. The substrate 10 has a top surface 101 and a bottom surface 102 opposite to the top surface 101. The substrate 10 includes glass, silicon, $SiO_2$, or a combination of two or more thereof. In some embodiments, the substrate 10 is formed of a glass material and a thickness of the substrate 10 is about 450 μm to about 550 μm. Conductive pillars 80, a conductive layer 94 and metal strips 82 are formed on the surface 101 of the substrate 10. In one or more embodiments, the conductive pillars 80, the conductive layer 94 and the metal strips 82 include, for example, Cu, or other metal, or a metal alloy, or other conductive material.

Referring to FIG. 18B, an insulation layer 72 is formed on the surface 101 of the substrate 10. The metal strips 84 are formed on a surface 722 of the insulation layer 72. In one or more embodiments, the insulation layer 72 is a wafer-level packaging PI film or an organic polymer film. The metal strips 84 are formed on the conductive pillars 80. Each of the conductive pillars 80 penetrates the insulation layer 72 and connects the corresponding metal strip 82 and the corresponding metal strip 84. A via opening 801 is formed in the insulation layer 72 to accommodate a conductive pillar 80', but without exposing the conductive layer 94. The conductive pillar 80' is formed over the conductive layer 94.

Referring to FIG. 18C, the substrate 10 is removed by a backside grinding process. A portion of the conductive layer 94, a portion of the conductive pillar 80' and a portion of the insulation layer 72 are removed to form a through-hole 801'. A pre-solder layer 40 (see FIG. 16) is formed on the conductive pillar 80' and the conductive layer 94 by a dipping process. In one or more embodiments, the pre-solder layer 40 includes, for example, Sn, Ag, SnAg, or other metal or alloy, or other conductive material. A passivation layer 74 is formed to cover the metal strips 84. One unit of the integrated passive component 9 of FIG. 16 is obtained after sawing or other material removal technique.

Figure 19:
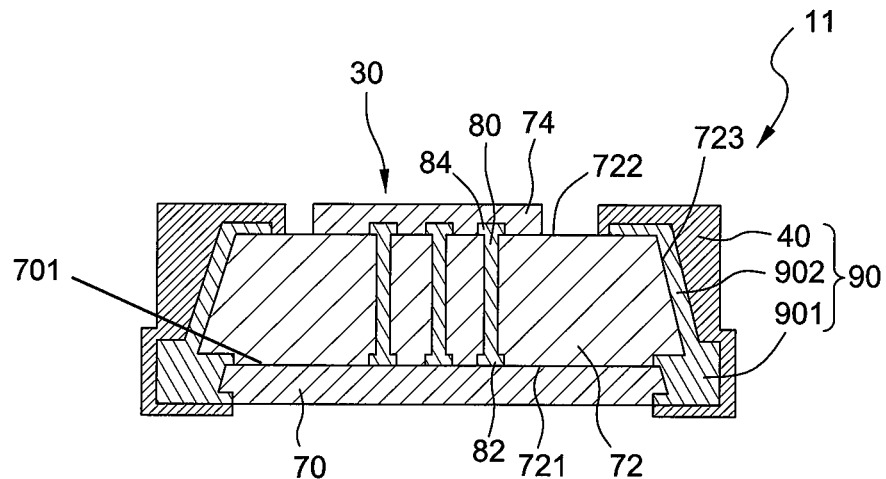
FIG. 19 is a cross-sectional view of an integrated passive component in accordance with some embodiments of the present disclosure.

FIG. 19 is a cross-sectional view of an integrated passive component 11 in accordance with some embodiments of the present disclosure. The integrated passive component 11 is similar in some ways to the integrated passive component 1 depicted in FIG. 1, and some same-numbered components are not described again with respect to FIG. 19. In the integrated passive component 11, the substrate 10 is not included. The integrated passive component 11 includes passivation layers 70 and 74, an inductor 30, an insulation layer 72, metal strips 82 and 84, conductive pillars 80 and an external contact 90. The insulation layer 72 may be also a support layer.

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 82 are disposed on a surface 701 and multiple metal strips 84 are disposed on a surface 722. In one or more embodiments, the insulation layer 72 is a wafer-level packaging PI film or an organic polymer film. The external contact 90 is electrically connected to the inductor 30. The external contact 90 contacts a portion of a surface 721 of the insulation layer 72, a portion of the surface 722 of the insulation layer 72 and a side surface 723 of the insulation layer 72. The side surface 723 of the insulation layer 72 forms an acute angle with respect to the surface 721 of the insulation layer 72, such as about 85 degrees or less or about 80 degrees or less. The external contact 90 includes a first portion 901, a second portion 902 and a pre-solder layer 40. In one or more embodiments, the first portion 901 and the second portion 902 include, for example, Cu, or other metal, or a metal alloy, or other conductive material. The first portion 901 contacts a portion of the surface 721 of the insulation layer 72. The second portion 902 contacts a portion of the surface 722 of the insulation layer 72 and the side surface 723 of insulation layer 72.

Figure 20:
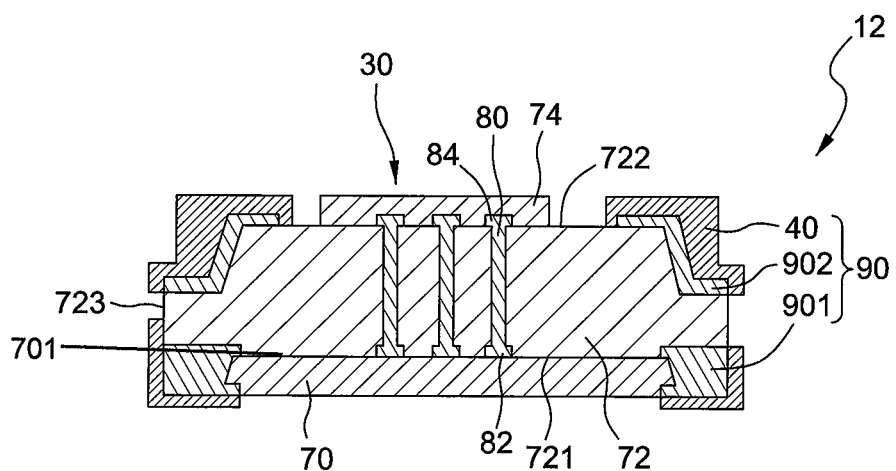
FIG. 20 is a cross-sectional view of an integrated passive component in accordance with some embodiments of the present disclosure.

FIG. 20 is a cross-sectional view of an integrated passive component 12 in accordance with some embodiments of the present disclosure. The integrated passive component 12 is similar in some ways to the integrated passive component 1 depicted in FIG. 1, and some same-numbered components are not described again with respect to FIG. 20. In the integrated passive component 12, the substrate 10 is not included. The integrated passive component 12 includes passivation layers 70 and 74, an inductor 30, an insulation layer 72, metal strips 82 and 84, conductive pillars 80 and an external contact 90. The insulation layer 72 may be also a support layer.

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 82 are disposed on a surface 701 and multiple metal strips 84 are disposed on a surface 722. In one or more embodiments, the insulation layer 72 is a wafer-level packaging PI film or an organic polymer film. The external contact 90 is electrically connected to the inductor 30. The external contact 90 contacts a portion of a surface 721 of the insulation layer 72, a portion of the surface 722 of the insulation layer 72 and a portion of a side surface 723 of the insulation layer 72. The external contact 90 includes a first portion 901, a second portion 902 and a pre-solder layer 40. The first portion 901 is separated from the second portion 902. In one or more embodiments, the first portion 901 and the second portion 902 include, for example, Cu, or other metal, or a metal alloy, or other conductive material. The first portion 901 contacts a portion of the surface 721 of the insulation layer 72. The second portion 902 contacts a portion of the surface 722 of the insulation layer 72 and a portion of the side surface 723 of the insulation layer 72.

Figure 21A:
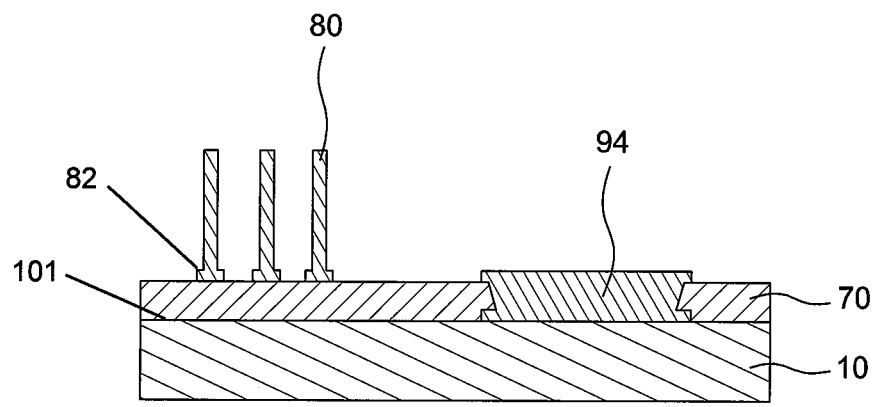
FIG. 21A, FIG. 21B, and FIG. 21C illustrate a method for manufacturing the integrated passive component of FIG. 19 in accordance with some embodiments.
Figure 21B:
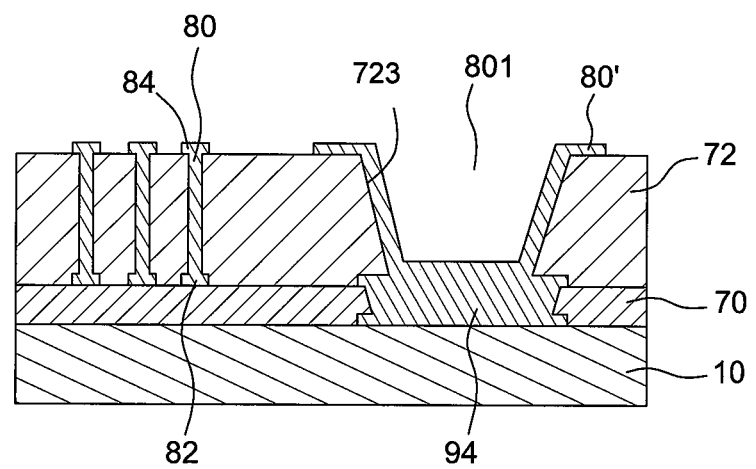
Figure 21C:
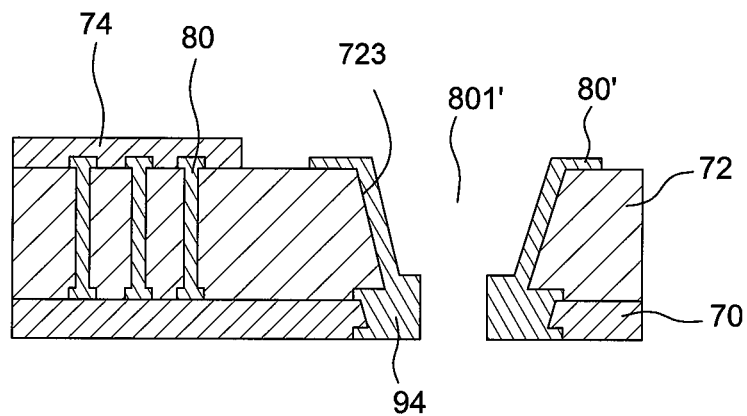

FIG. 21A, FIG. 21B, and FIG. 21C illustrate a method for manufacturing an integrated passive component 11 of FIG. 19 in accordance with some embodiments. Referring to FIG. 21A, a substrate 10 is provided. The substrate 10 has a top surface 101. The substrate 10 includes glass, silicon, $SiO_2$, or a combination of two or more thereof. In some embodiments, the substrate 10 is formed of a glass material and a thickness of the substrate 10 is about 450 μm to about 550 μm. A passivation layer 70 is formed on the surface 101 of the substrate 10. Conductive pillars 80 and metal strips 82 are formed on the passivation layer 70. A conductive layer 94 is formed on the surface 101 of the substrate 10. In one or more embodiments, the conductive pillars 80, the conductive layer 94 and the metal strips 82 include, for example, Cu, or other metal, or a metal alloy, or other conductive material.

Referring to FIG. 21B, an insulation layer 72 is formed on the passivation layer 70. Metal strips 84 are formed on the insulation layer 72. In one or more embodiments, the insulation layer 72 is a wafer-level packaging PI film or an organic polymer film. The metal strips 84 are formed on the conductive pillars 80. Each of the conductive pillars 80 penetrates the insulation layer 72 and connects the corresponding metal strip 82 and the corresponding metal strip 84. A via opening 801 is formed in the insulation layer 72 to accommodate a conductive pillar 80'. The conductive pillar 80' is formed on the conductive layer 94 which is exposed by the via opening 801.

Referring to FIG. 21C, the substrate 10 is removed by a backside grinding process. A portion of the conductive layer 94 and a portion of the conductive pillar 80' are removed to form a through-hole 801'. The through-hole 801' can accommodate the conductive pillar 80'. A pre-solder layer 40 (see FIG. 19) is formed on the conductive pillar 80' and the conductive layer 94 by a dipping process. In one or more embodiments, the pre-solder layer 40 includes, for example, Sn, Ag, SnAg, or other metal or alloy, or other conductive material. A passivation layer 74 is formed to cover the metal strips 84. One unit of the integrated passive component 11 of FIG. 19 is obtained after sawing or other material removal technique.

Figure 22A:
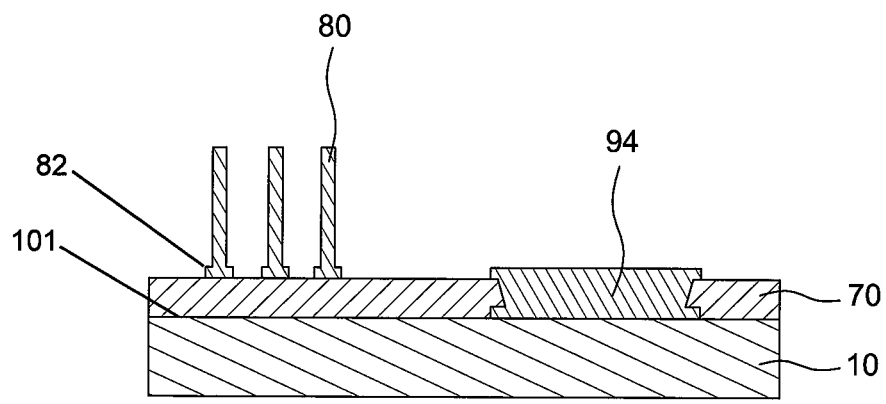
FIG. 22A, FIG. 22B, and FIG. 22C illustrate a method for manufacturing the integrated passive component of FIG. 20 in accordance with some embodiments.
Figure 22B:
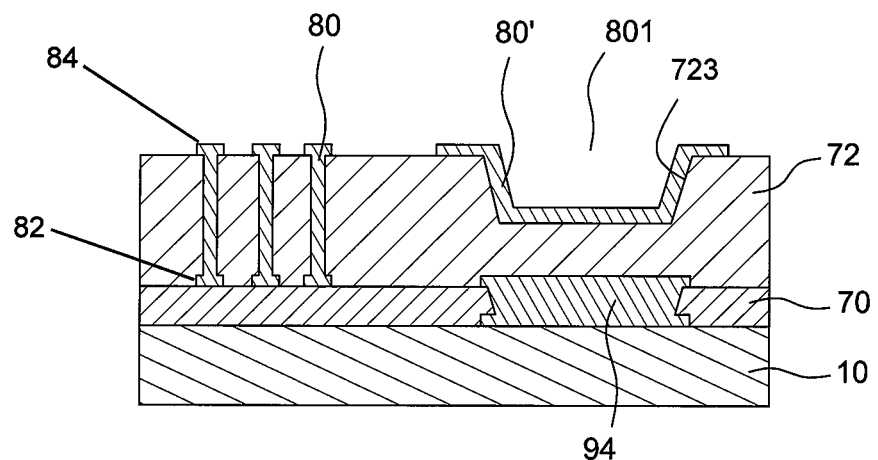
Figure 22C:
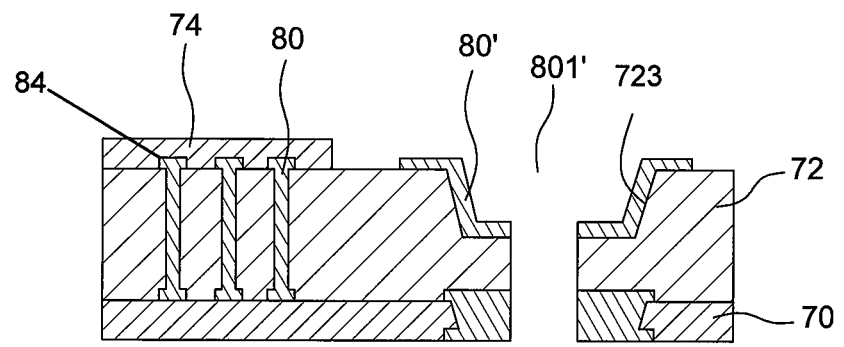

FIG. 22A, FIG. 22B, and FIG. 22C illustrate a method for manufacturing an integrated passive component 12 of FIG. 20 in accordance with some embodiments. Referring to FIG. 22A, a substrate 10 is provided. The substrate 10 has a top surface 101. The substrate 10 includes glass, silicon, $SiO_2$, or a combination of two or more thereof. In some embodiments, the substrate 10 is formed of a glass material and a thickness of the substrate 10 is about 450 μm to about 550 μm. A passivation layer 70 is formed on the surface 101 of the substrate 10. Conductive pillars 80 and metal strips 82 are formed on the passivation layer 70. A conductive layer 94 is formed on the surface 101 of the substrate 10. In one or more embodiments, the conductive pillars 80, the conductive layer 94 and the metal strips 82 include, for example, Cu, or other metal, or a metal alloy, or other conductive material.

Referring to FIG. 22B, an insulation layer 72 is formed on the passivation layer 70. The metal strips 84 are formed on the insulation layer 72. In one or more embodiments, the insulation layer 72 is a wafer-level packaging PI film or an organic polymer film. The metal strips 84 are formed on the conductive pillars 80. Each of the conductive pillars 80 penetrates the insulation layer 72 and connects the corresponding metal strip 82 and the corresponding metal strip 84. A via opening 801 is formed in the insulation layer 72 to accommodate a conductive pillar 80', but without exposing the conductive layer 94. The conductive pillar 80' is formed over the conductive layer 94. The conductive pillar 80' is separated from the conductive layer 94.

Referring to FIG. 22C, the substrate 10 is removed by a backside grinding process. A portion of the conductive layer 94 and a portion of the conductive pillar 80' are removed to form a through-hole 801'. The through-hole 801' can accommodate the conductive pillar 80'. A pre-solder layer 40 (see FIG. 20) is formed on the conductive pillar 80' and the conductive layer 94 by a dipping process. In one or more embodiments, the pre-solder layer 40 includes, for example, Sn, Ag, SnAg, or other metal or alloy, or other conductive material. A passivation layer 74 is formed to cover the metal strips 84. One unit of the integrated passive component 12 of FIG. 20 is obtained after sawing or other material removal technique.

Figure 23:
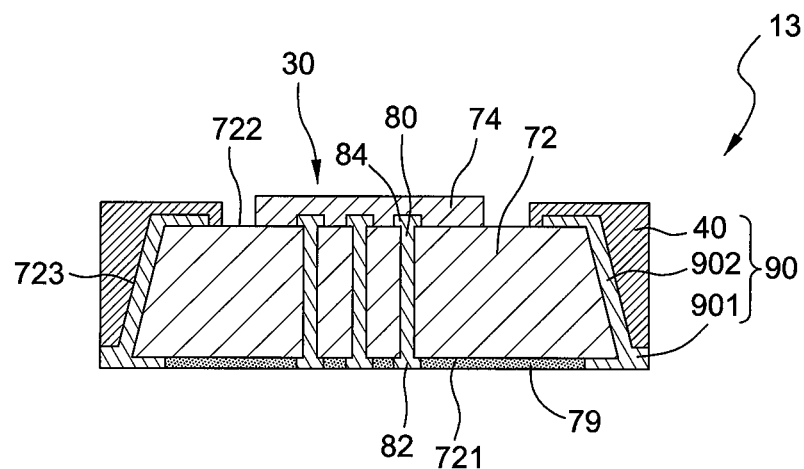
FIG. 23 is a cross-sectional view of an integrated passive component in accordance with some embodiments of the present disclosure.

FIG. 23 is a cross-sectional view of an integrated passive component 13 in accordance with some embodiments of the present disclosure. The integrated passive component 13 is similar in some ways to the integrated passive component 1 depicted in FIG. 1, and some same-numbered components are not described again with respect to FIG. 23. In the integrated passive component 13, the substrate 10 is not included. The integrated passive component 13 includes a passivation layer 74, an inductor 30, insulation layers 72 and 79, metal strips 82 and 84, conductive pillars 80, and an external contact 90. The insulation layer 72 may be also a support layer. The insulation layer 79 may be a protection film (e.g., including a resin, such as epoxy, or a molding compound).

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 82 are disposed on a surface 721 and multiple metal strips 84 are disposed on a surface 722. In one or more embodiments, the insulation layer 72 is a wafer-level packaging PI film or an organic polymer film. The external contact 90 is electrically connected to the inductor 30. The external contact 90 contacts a portion of the surface 721 of the insulation layer 72, a portion of the surface 722 of the insulation layer 72 and a side surface 723 of the insulation layer 72. The side surface 723 of the insulation layer 72 forms an acute angle with respect to the surface 721 of the insulation layer 72, such as about 85 degrees or less or about 80 degrees or less. The external contact 90 includes a first portion 901, a second portion 902 and a pre-solder layer 40. In one or more embodiments, the first portion 901 and the second portion 902 include, for example, Cu, or other metal, or a metal alloy, or other conductive material. The first portion 901 contacts a portion of the surface 721 of the insulation layer 72. The second portion 902 contacts a portion of the surface 722 of the insulation layer 72 and the side surface 723 of insulation layer 72. The insulation layer 79 contacts a portion of the surface 721 of the insulation layer 72.

Figure 24:
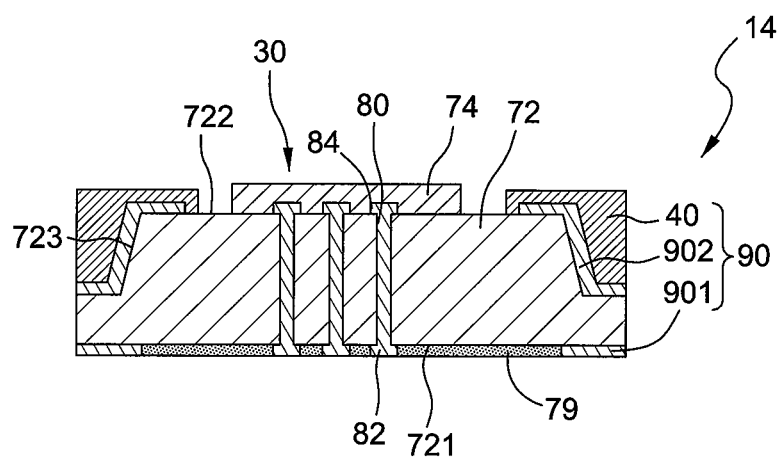
FIG. 24 is a cross-sectional view of an integrated passive component in accordance with some embodiments of the present disclosure.

FIG. 24 is a cross-sectional view of an integrated passive component 14 in accordance with some embodiments of the present disclosure. The integrated passive component 14 is similar in some ways to the integrated passive component 1 depicted in FIG. 1, and some same-numbered components are not described again with respect to FIG. 24. In the integrated passive component 14, the substrate 10 is not included. The integrated passive component 12 includes a passivation layer 74, an inductor 30, insulation layers 72 and 79, metal strips 82 and 84, conductive pillars 80 and an external contact 90. The insulation layer 72 may be also a support layer. The insulation layer 79 may be a protection film (e.g., including a resin, such as epoxy, or a molding compound).

Multiple conductive pillars 80 are disposed within the insulation layer 72. Each of the conductive pillars 80 penetrates the insulation layer 72 and connects the corresponding metal strip 82 and the corresponding metal strip 84. Multiple metal strips 82 are disposed on a surface 721 and multiple metal strips 84 are disposed on a surface 722. In one or more embodiments, the insulation layer 72 is a wafer-level packaging PI film or an organic polymer film. The external contact 90 is electrically connected to the inductor 30. The external contact 90 contacts a portion of the surface 721 of the insulation layer 72, a portion of the surface 722 of the insulation layer 72 and a portion of a side surface 723 of the insulation layer 72. The external contact 90 includes a first portion 901, a second portion 902 and a pre-solder layer 40. The first portion 901 is separated from the second portion 902. In one or more embodiments, the first portion 901 and the second portion 902 include, for example, Cu, or other metal, or a metal alloy, or other conductive material. The first portion 901 contacts a portion of the surface 721 of the insulation layer 72. The second portion 902 contacts a portion of the surface 722 of the insulation layer 72 and a portion of the side surface 723 of the insulation layer 72.

Figure 25A:
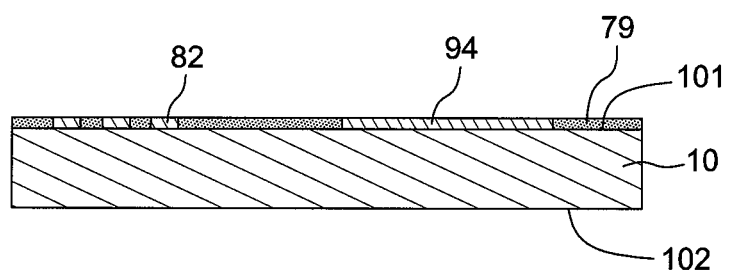
FIG. 25A, FIG. 25B, and FIG. 25C illustrate a method for manufacturing the integrated passive component of FIG. 23 in accordance with some embodiments.
Figure 25B:
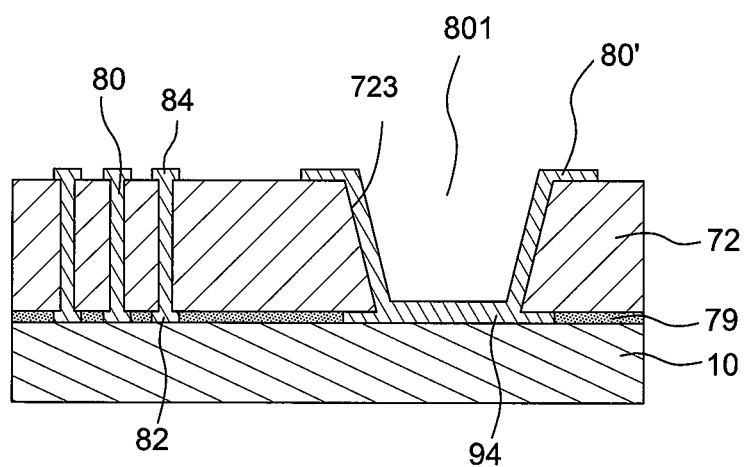
Figure 25C:
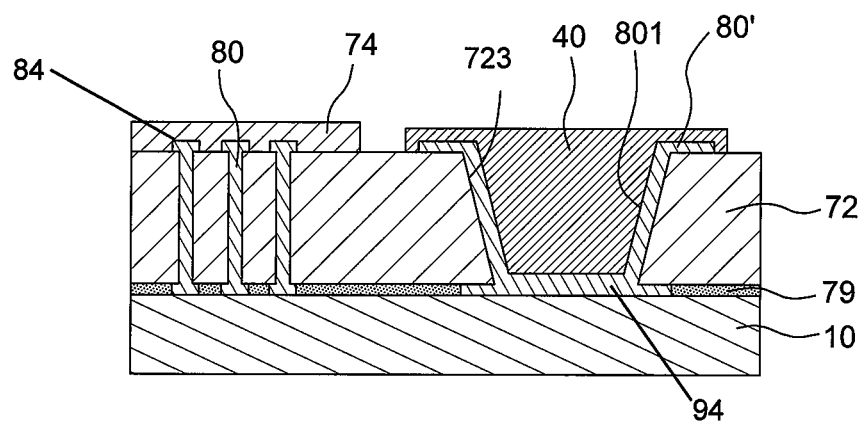

FIG. 25A, FIG. 25B, and FIG. 25C illustrate a method for manufacturing an integrated passive component 13 of FIG. 23 in accordance with some embodiments. Referring to FIG. 25A, a substrate 10 is provided. The substrate 10 has a top surface 101 and a bottom surface 102 opposite to the top surface 101. The substrate 10 includes glass, silicon, $SiO_2$, or a combination of two or more thereof. In some embodiments, the substrate 10 is formed of a glass material and a thickness of the substrate 10 is about 450 µm to about 550 µm. A conductive layer 94 and metal strips 82 are formed on the surface 101 of the substrate 10. An insulation layer 79 is formed on the surface 101 of the substrate 10. The insulation layer 79 may be a protection film (e.g., including a resin, such as epoxy, or a molding compound). In one or more embodiments, the metal strips 82 and the conductive layer 94 include, for example, Cu, or other metal, or a metal alloy, or other conductive material.

Referring to FIG. 25B, an insulation layer 72 is formed on the substrate 10 and on the insulation layer 79. Conductive pillars 80 and metal strips 84 are formed on the metal strips 82. The metal strips 84 are formed on the insulation layer 72. In one or more embodiments, the insulation layer 72 is a wafer-level packaging PI film or an organic polymer film. Each of the conductive pillars 80 penetrates the insulation layer 72 and connects the corresponding metal strip 82 and the corresponding metal strip 84. A via opening 801 is formed in the insulation layer 72 to accommodate a conductive pillar 80'. The conductive pillar 80' is formed on the conductive layer 94 which is exposed by the via opening 801.

Referring to FIG. 25C, a pre-solder layer 40 is formed on the conductive pillar 80' and the conductive layer 94 by a dipping process. In one or more embodiments, the pre-solder layer 40 includes, for example, Sn, Ag, SnAg, or other metal or alloy, or other conductive material. A passivation layer 74 is formed to cover the metal strips 84. Next, the substrate 10 is removed by a backside grinding process. After removing the substrate 10, one unit of the integrated passive component 13 of FIG. 23 is obtained.

Figure 26A:
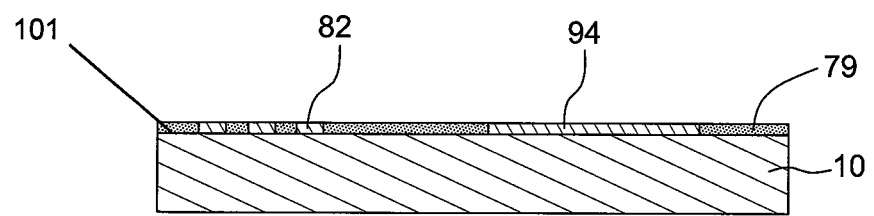
FIG. 26A, FIG. 26B, and FIG. 26C illustrate a method for manufacturing the integrated passive component of FIG. 24 in accordance with some embodiments.
Figure 26B:
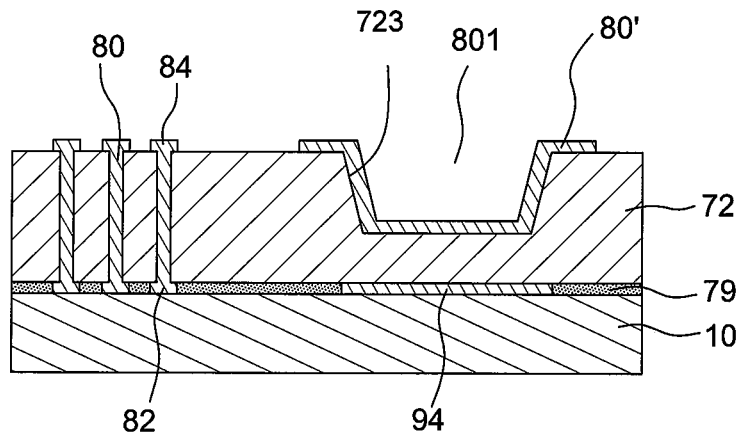
Figure 26C:
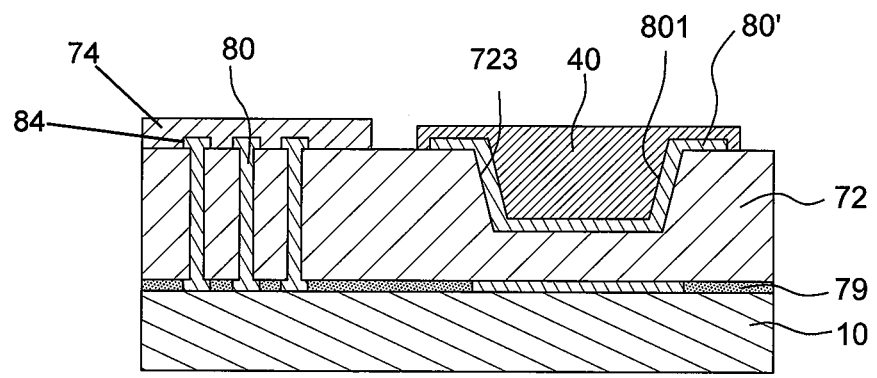

FIG. 26A, FIG. 26B, and FIG. 26C illustrate a method for manufacturing an integrated passive component 14 of FIG. 24 in accordance with some embodiments. Referring to FIG. 26A, a substrate 10 is provided. The substrate 10 has a top surface 101. The substrate 10 includes glass, silicon, $SiO_2$, or a combination of two or more thereof. In some embodiments, the substrate 10 is formed of a glass material and a thickness of the substrate 10 is about 450 µm to about 550 µm. A conductive layer 94 and metal strips 82 are formed on the surface 101 of the substrate 10. An insulation layer 79 is formed on the surface 101 of the substrate 10. The insulation layer 79 may be a protection film (e.g., including a resin, such as epoxy, or a molding compound). In one or more embodiments, the metal strips 82 and the conductive layer 94 include, for example, Cu, or other metal, or a metal alloy, or other conductive material.

Referring to FIG. 26B, an insulation layer 72 is formed on the substrate 10 and on the insulation layer 79. Conductive pillars 80 and metal strips 84 are formed on the metal strips 82. The metal strips 84 are formed on the insulation layer 72. In one or more embodiments, the insulation layer 72 is a wafer-level packaging PI film or an organic polymer film. Each of the conductive pillars 80 penetrates the insulation layer 72 and connects the corresponding metal strip 82 and the corresponding metal strip 84. A via opening 801 is formed in the insulation layer 72 to accommodate a conductive pillar 80', but without exposing the conductive layer 94. The conductive pillar 80' is formed over the conductive layer 94.

Referring to FIG. 26C, a pre-solder layer 40 is formed on the conductive pillar 80' by a dipping process. In one or more embodiments, the pre-solder layer 40 includes, for example, Sn, Ag, SnAg, or other metal or alloy, or other conductive material. A passivation layer 74 is formed to cover the metal strips 84. Next, the substrate 10 is removed by a backside grinding process. After removing the substrate 10, one unit of the integrated passive component 14 of FIG. 24 is obtained.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 µm, no greater than 1 µm, no greater than 5 µm, no greater than 10 µm, or no greater than 15 µm. In the description of some embodiments, a component provided "on" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An integrated passive component, comprising:
   a capacitor;
   a first passivation layer surrounding the capacitor;
   an inductor on the first passivation layer and electrically connected to the capacitor, and wherein the inductor comprises a plurality of conductive pillars;
   an insulation layer on the first passivation layer and surrounding each of the conductive pillars, and wherein the insulation layer comprises a first surface adjacent to the first passivation layer, a second surface opposite to the first surface, and a side surface extending between the first surface and the second surface; and
   an external contact electrically connected to the inductor and contacting the second surface of the insulation layer and the side surface of the insulation layer, wherein the external contact further contacts the first surface of the insulation layer.

2. The integrated passive component according to claim 1, wherein a ratio of a width of at least one of the conductive pillars to a height of the at least one of the conductive pillars is about 1:7.

3. The integrated passive component according to claim 1, wherein the inductor comprises a plurality of first metal strips on the first passivation layer and a plurality of second metal strips on the second surface of the insulation layer, and wherein each of the conductive pillars penetrates through the insulation layer and connects a corresponding one of the first metal strips and a corresponding one of the second metal strips.

4. The integrated passive component according to claim 3, further comprising a second passivation layer covering the second metal strips.

5. The integrated passive component according to claim 3, wherein the capacitor comprises a top electrode, a bottom electrode and a dielectric layer between the top electrode and the bottom electrode, and wherein the integrated passive component further comprises a third metal strip on the first passivation layer and connected with the top electrode and a fourth metal strip on the first passivation layer and connected with the bottom electrode, and wherein the third metal strip and the fourth metal strip are connected with at least one of the second metal strips.

6. The integrated passive component according to claim 5, further comprising a substrate, and wherein the capacitor and the first passivation layer are disposed on the substrate, and the bottom electrode contacts the substrate.

7. The integrated passive component according to claim 1, wherein the external contact comprises a first portion and a second portion, and wherein the first portion contacts the first surface of the insulation layer, and wherein the second portion contacts the second surface and the side surface of the insulation layer.

8. The integrated passive component according to claim 7, wherein the first portion is isolated from the second portion.

9. The integrated passive component according to claim 7, wherein the external contact comprises a pre-solder layer disposed on the second portion.

10. The integrated passive component according to claim 7, wherein the external contact comprises a pre-solder layer disposed on the first portion and the second portion.

11. The integrated passive component according to claim 1, wherein the insulation layer is a polyimide film.

12. An integrated passive component, comprising:
    a first passivation layer;
    an insulation layer comprising a first surface adjacent to the first passivation layer, a second surface opposite to the first surface, and a side surface extending between the first surface and the second surface;
    a plurality of first metal strips on the first passivation layer;
    a plurality of second metal strips on the second surface of the insulation layer;
    a plurality of conductive pillars within the insulation layer, each of the conductive pillars penetrating the insulation layer and connecting a corresponding one of the first metal strips and a corresponding one of the second metal strips; and
    an external contact electrically connected to at least one of the second metal strips and contacting the second surface of the insulation layer and the side surface of the insulation layer, wherein the external contact comprises a pre-solder layer.

13. The integrated passive component according to claim 12, wherein the external contact further contacts the first surface of the insulation layer.

14. The integrated passive component according to claim 12, wherein the external contact comprises a first portion and a second portion, and wherein the first portion contacts the first surface of the insulation layer, and wherein the second portion contacts the second surface and the side surface of the insulation layer.

15. The integrated passive component according to claim 14, wherein the first portion is isolated from the second portion.

16. The integrated passive component according to claim 14, wherein the pre-solder layer is disposed on the second portion.

17. The integrated passive component according to claim 14, wherein the pre-solder layer is disposed on the first portion and the second portion.

18. The integrated passive component according to claim 12, further comprising a second passivation layer covering the second metal strips.

19. The integrated passive component according to claim 12, further comprising a capacitor within the first passivation layer, and wherein the capacitor comprises a top electrode, a bottom electrode and a dielectric layer between the top electrode and the bottom electrode.

20. The integrated passive component according to claim 19, further comprising a third metal strip on the first passivation layer and a fourth metal strip on the first passivation layer, and wherein the third metal strip is electrically connected with the top electrode and the fourth metal strip is electrically connected with the bottom electrode.

21. The integrated passive component according to claim 19, further comprising a substrate, and wherein the capacitor and the first passivation layer are disposed on the substrate, and the bottom electrode contacts the substrate.

22. A method for manufacturing an integrated passive component, comprising:
    forming a plurality of first conductive pillars and a second conductive pillar on a substrate;
    forming an insulation layer surrounding the first conductive pillars and the second conductive pillar;
    forming an upper passivation layer on the insulation layer and exposing the second conductive pillar; and
    sawing the second conductive pillar to form an external contact.

23. The method according to claim 22, further comprising removing the substrate prior to sawing the second conductive pillar.

24. The method according to claim 22, further comprising thinning the substrate prior to sawing the second conductive pillar.

25. The method according to claim 22, further comprising providing a conductive pad within the substrate, and wherein forming the second conductive pillar comprises forming the second conductive pillar on the conductive pad.

26. The method according to claim 22, further comprising forming a lower passivation layer between the first conductive pillars and the substrate.

27. The method according to claim 22, further comprising forming a pre-solder layer on a remaining portion of the second conductive pillar.

28. The method according to claim 22, wherein forming the insulation layer comprises forming a through-hole in the insulation layer to accommodate the second conductive pillar.

29. The method according to claim 22, wherein forming the insulation layer comprises forming a via opening in the insulation layer to accommodate the second conductive pillar.

\* \* \* \* \*